(12) United States Patent
Shibusawa et al.

(10) Patent No.: US 8,872,198 B2
(45) Date of Patent: Oct. 28, 2014

(54) LUMINAIRE AND LIGHT-EMITTING APPARATUS WITH LIGHT-EMITTING DEVICE

(75) Inventors: Soichi Shibusawa, Yokosuka (JP); Kiyoshi Nishimura, Yokosuka (JP); Kozo Ogawa, Yokosuka (JP); Nobuhiko Betsuda, Yokosuka (JP); Shuhei Matsuda, Yokosuka (JP); Masatoshi Kumagai, Yokosuka (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 210 days.

(21) Appl. No.: 13/090,645

(22) Filed: Apr. 20, 2011

(65) Prior Publication Data

US 2011/0254023 A1 Oct. 20, 2011

(30) Foreign Application Priority Data

Apr. 20, 2010 (JP) ................................ 2010-096744
Jun. 17, 2010 (JP) ................................ 2010-138766

(51) Int. Cl.
| | | |
|---|---|---|
| H01L 33/00 | (2010.01) | |
| H01L 25/075 | (2006.01) | |
| F21V 19/00 | (2006.01) | |
| F21K 99/00 | (2010.01) | |
| H05K 3/28 | (2006.01) | |
| F21Y 101/02 | (2006.01) | |
| F21S 8/04 | (2006.01) | |
| H01L 33/50 | (2010.01) | |
| F21V 23/06 | (2006.01) | |
| F21Y 103/00 | (2006.01) | |
| H05K 1/02 | (2006.01) | |

(52) U.S. Cl.
CPC ..... *F21V 19/0055* (2013.01); *H01L 2933/0041* (2013.01); *F21Y 2101/02* (2013.01); *F21S 8/04* (2013.01); *H01L 25/0753* (2013.01); *H01L 2224/48091* (2013.01); *H01L 33/505* (2013.01); *H01L 2224/48137* (2013.01); *F21V 23/06* (2013.01); *H01L 2224/73265* (2013.01); *H05K 2201/10106* (2013.01); *F21Y 2103/003* (2013.01); *H05K 1/0209* (2013.01); *F21K 9/30* (2013.01); *H05K 3/284* (2013.01)
USPC ........................................................ 257/88

(58) Field of Classification Search
USPC ................................. 257/88, E27.121, 91, 98
See application file for complete search history.

(56) References Cited

U.S. PATENT DOCUMENTS

| | | | |
|---|---|---|---|
| 2008/0100774 | A1 | 5/2008 | Jeon |
| 2009/0134421 | A1* | 5/2009 | Negley ............................ 257/98 |

(Continued)

FOREIGN PATENT DOCUMENTS

| | | |
|---|---|---|
| CN | 2572501 | 9/2003 |
| CN | 101093849 | 12/2007 |

(Continued)

OTHER PUBLICATIONS

English Language Abstract of JP 2009-54989 published on Mar. 12, 2009.

(Continued)

*Primary Examiner* — Tran Tran
(74) *Attorney, Agent, or Firm* — DLA Piper LLP (US)

(57) ABSTRACT

According to one embodiment, the light-emitting apparatus is provided with a substrate, a plurality of light-emitting devices, and a phosphor layer. The plurality of light-emitting devices are mounted on the substrate. The phosphor layer is formed of a translucent resin containing a phosphor and includes a phosphor portion that is formed in a convex shape and covers a predetermined number of the light-emitting device. Bases of the adjacent phosphor portions are formed by being linked with one another.

4 Claims, 19 Drawing Sheets

(56) References Cited

U.S. PATENT DOCUMENTS

| | | | |
|---|---|---|---|
| 2010/0065983 A1 | 3/2010 | Kawakubo | |
| 2010/0072496 A1* | 3/2010 | Kobayakawa | 257/91 |
| 2010/0181582 A1* | 7/2010 | Li et al. | 257/91 |

FOREIGN PATENT DOCUMENTS

| | | |
|---|---|---|
| CN | 101541499 | 9/2009 |
| JP | 2-094673 | 4/1990 |
| JP | 2002-299694 | 10/2002 |
| JP | 2005-311269 | 11/2005 |
| JP | 2006-210490 | 8/2006 |
| JP | 2008-053571 | 3/2008 |
| JP | 2008-85302 | 4/2008 |
| JP | 2008-166081 | 7/2008 |
| JP | 2009-54989 | 3/2009 |
| JP | 2009-088054 | 4/2009 |
| WO | WO 2009/141982 | 11/2009 |
| WO | WO 2009/145298 | 12/2009 |

OTHER PUBLICATIONS

English Language Translation of JP 2009-54989 published on Mar. 12, 2009.
English Language Abstract of JP 2008-85302 published on Apr. 10, 2008.
English Language Translation of JP 2008-85302 published on Apr. 10, 2008.
English Language Abstract of JP 2008-166081 published Jul. 17, 2008.
English Language Translation of JP 2008-166081 published Jul. 17, 2008.
Chinese Office Action issued in CN 201110102112.4 on Apr. 3, 2013.
English Language Translation of Chinese Office Action issued in CN 201110102112.4 on Apr. 3, 2013.
English Language Abstract of CN 101541499 published Sep. 23, 2009.
English Language Abstract of CN 10109849 published Dec. 26, 2007.
English Language Abstract of JP 2006-210490 published Aug. 10, 2006.
English Language Translation of JP 2006-210490 published Aug. 10, 2006.
English Language Abstract of CN 2572501 published Sep. 10, 2003.
European Search Report issued in EP 11162869.9 on Sep. 18, 2013.
English Language Abstract and Translation of JP 2002-299694 published on Oct. 11, 2002.
English Language Abstract and Translation of JP 2009-088054 published on Apr. 23, 2009.
Japanese Office Action issued in JP 2010-138766 on Nov. 6, 2013.
English Language Translation of Japanese Office Action issued in JP 2010-138766 on Nov. 6, 2013.
English Language Abstract and Translation of JP 2008-053571 published on Mar. 6, 2008.
English Language Abstract and Translation of JP 2005-311269 published on Nov. 4, 2005.
English Language Abstract of JP 02-094673 published Apr. 5, 1990.
Chinese Office Action issued in CN 201110102112.4 on Nov. 29, 2013.
English Language Translation of Chinese Office Action issued in CN 201110102112.4 on Nov. 29, 2013.
Japanese Office Action issued in JP 2010-138766 on Jan. 10, 2014.
English Language Translation of Japanese Office Action issued in JP 2010-138766 on Jan. 10, 2014.

* cited by examiner

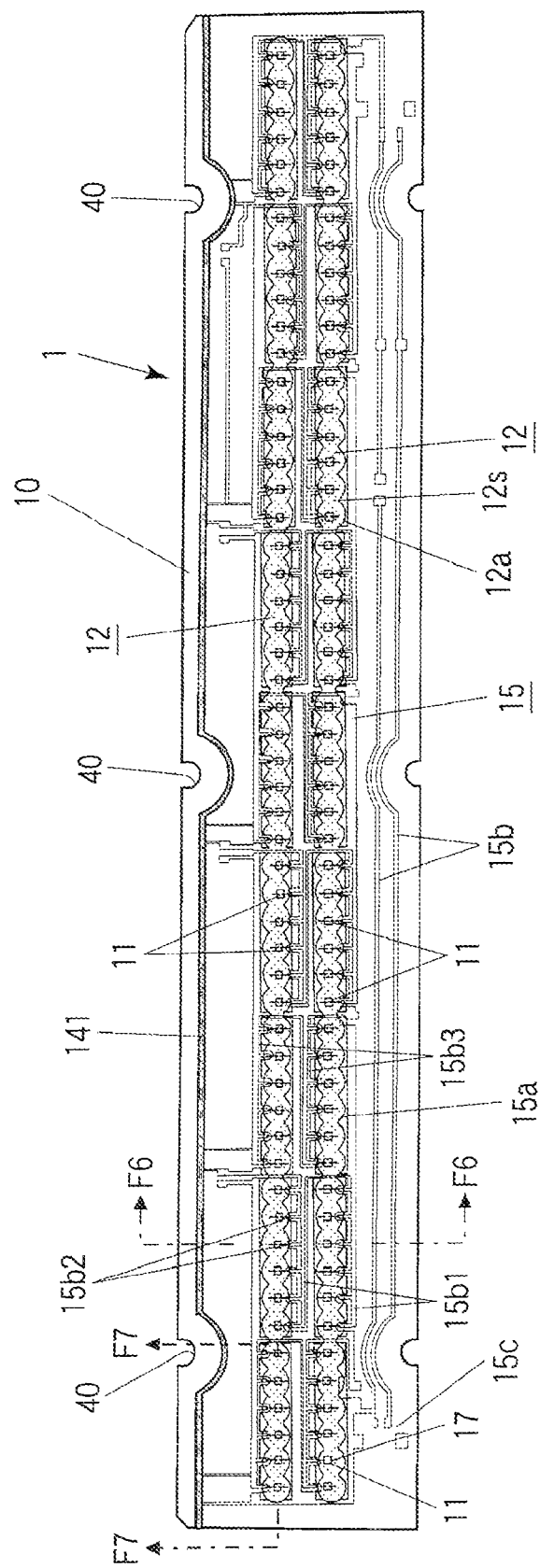
F I G. 4

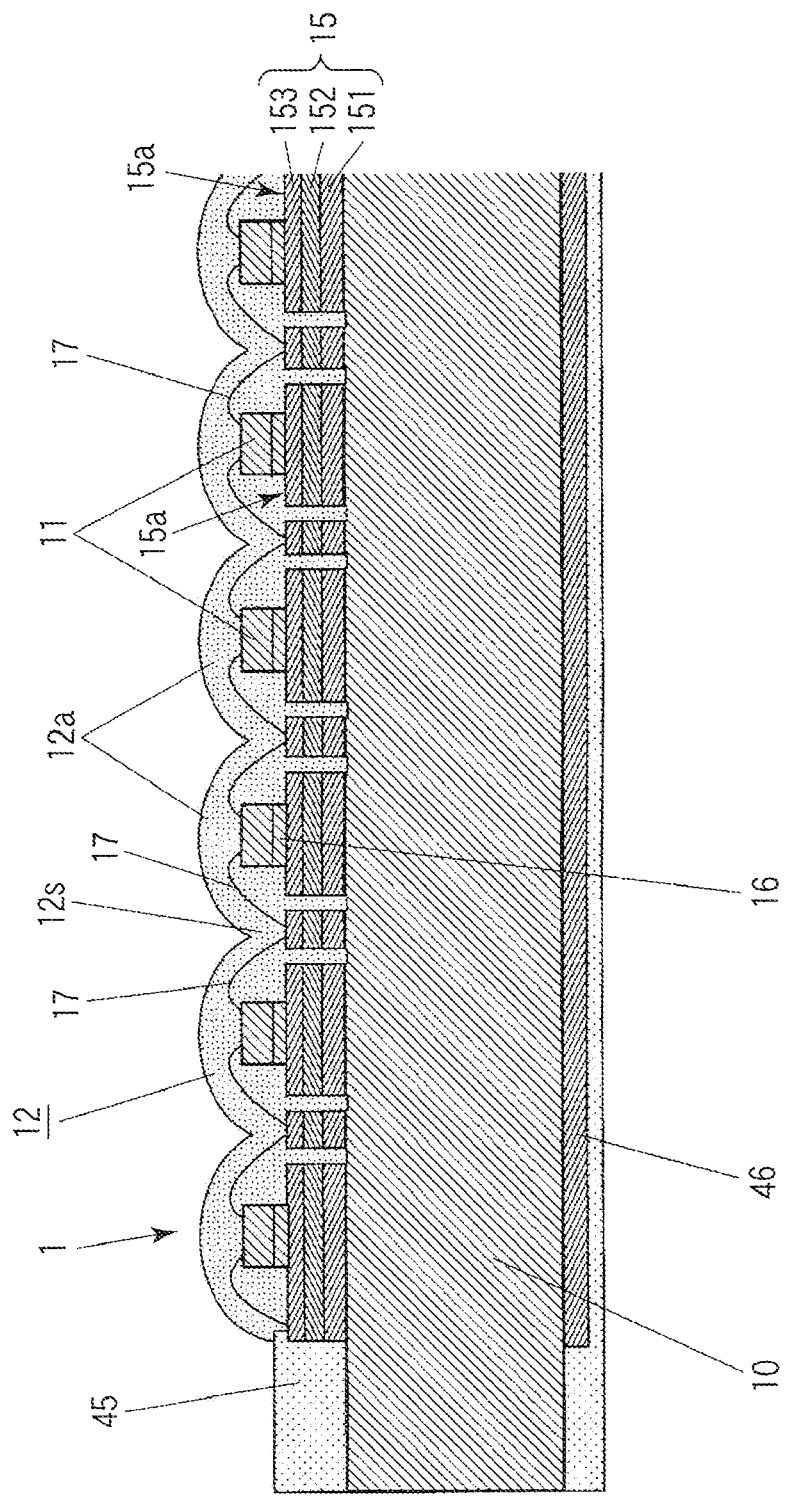
F I G. 12

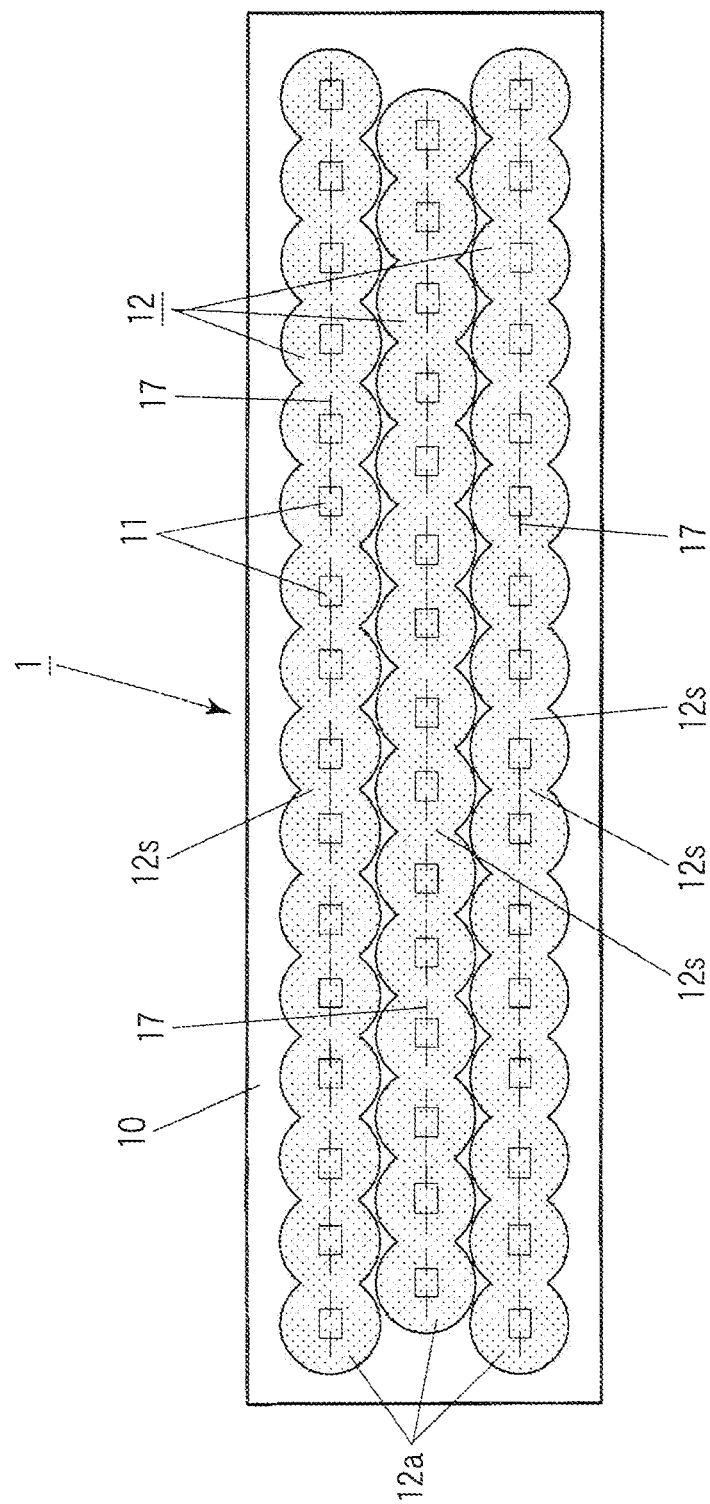
F I G. 13

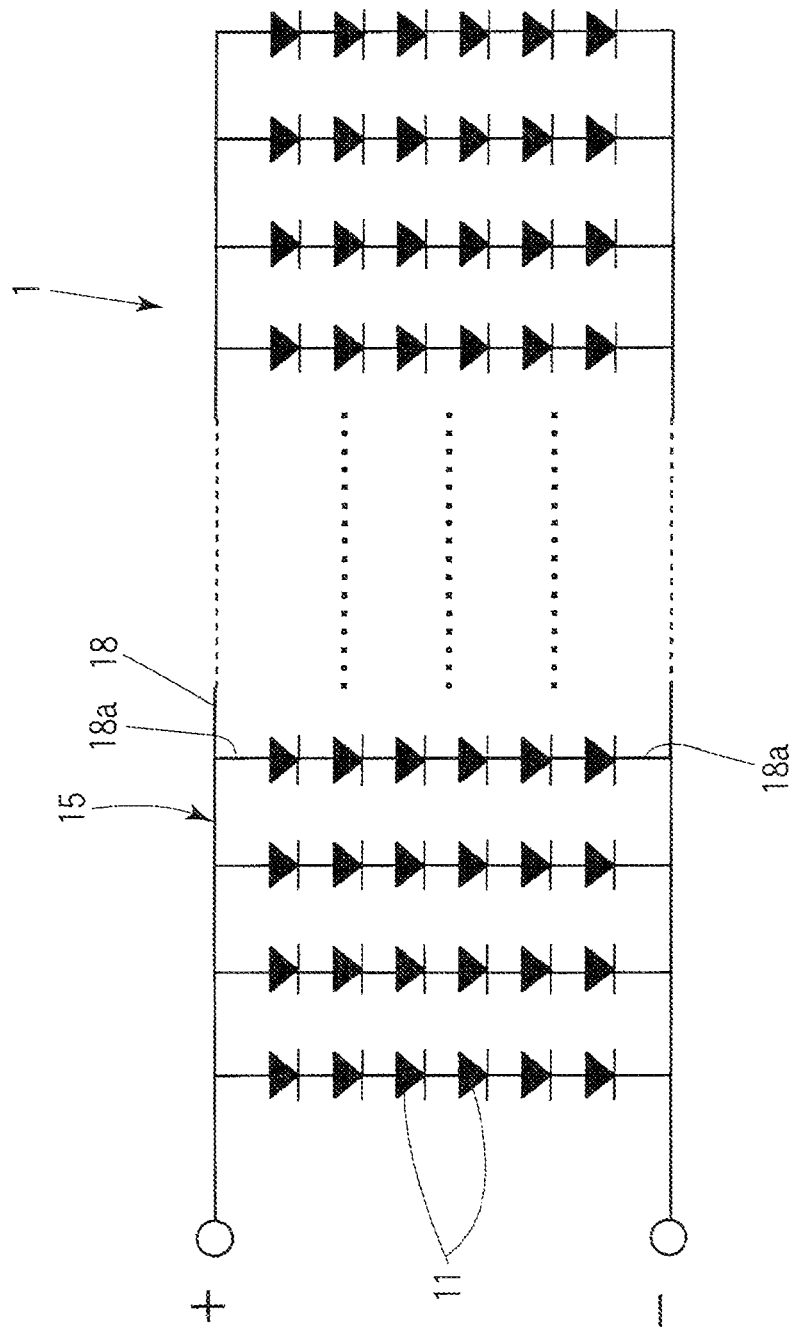
F I G. 19

US 8,872,198 B2

LUMINAIRE AND LIGHT-EMITTING APPARATUS WITH LIGHT-EMITTING DEVICE

CROSS-REFERENCE TO RELATED APPLICATIONS

This application is based upon and claims the benefit of priority from Japanese Patent Applications No. 2010-096744, filed Apr. 20, 2010; and No. 2010-138766, filed Jun. 17, 2010; the entire contents of both of which are incorporated herein by reference.

FIELD

Embodiments described herein relate generally to a luminaire and a light-emitting apparatus with, a light-emitting device such as a light-emitting diode (LED).

BACKGROUND

A luminaire in which a plurality of light-emitting devices such as light-emitting diodes (LED) are provided as a light source on a substrate to obtain a certain amount of light has been developed. Such a luminaire is known as a direct-mounting type base light that can be directly fitted to the ceiling. In this luminaire, a plurality of light-emitting devices are mounted on a substrate formed of a ceramics material. A light-emitting portion formed of the plurality of light-emitting devices is covered and sealed, in its entirety, by a sealing resin layer containing a phosphor, which is called a phosphor layer.

A luminaire including a plurality of light-emitting devices mounted on a substrate and a reflector formed in a frame shape which is fitted to surround the light-emitting devices is also available. In this luminaire, an entire region surrounded by the reflector is filled with a sealing resin containing a phosphor. The plurality of light-emitting devices are covered and sealed by the sealing resin layer. However, it is expensive to cover the entire light-emitting portion with the sealing resin layer. In addition, light output from the light-emitting device is totally reflected when light enters an interface of the sealing resin layer at a critical angle. As a result, the light output from the light-emitting device is repeatedly reflected in the sealing resin layer, which causes a reflection loss and a reduction in luminous efficacy.

Light-emitting devices can be sealed individually by dripping a sealing resin containing a phosphor on each of the light-emitting devices and hardening the sealing resin after dripping in a semispherical mound shape. This can reduce cost because the sealing resin layer is formed for each of the light-emitting devices. However, if variations in volume are present in the individual sealing resin layers, variations in light output power and luminescent color of the individual light-emitting devices will occur. As a result, the luminaire, as a whole, may not emit uniform light.

BRIEF DESCRIPTION OF THE DRAWINGS

FIG. 4 is a plan view of the substrate in FIG. 3 on which a phosphor layer is formed;
FIG. 12 is a schematic cross-sectional view of a substrate of the light-emitting apparatus corresponding to FIG. 7;
FIG. 13 is a simplified plan view of a light-emitting apparatus of a third embodiment;
FIG. 19 is a wiring diagram of light-emitting devices of the light-emitting apparatus in FIG. 15.

DETAILED DESCRIPTION

Figure 1:
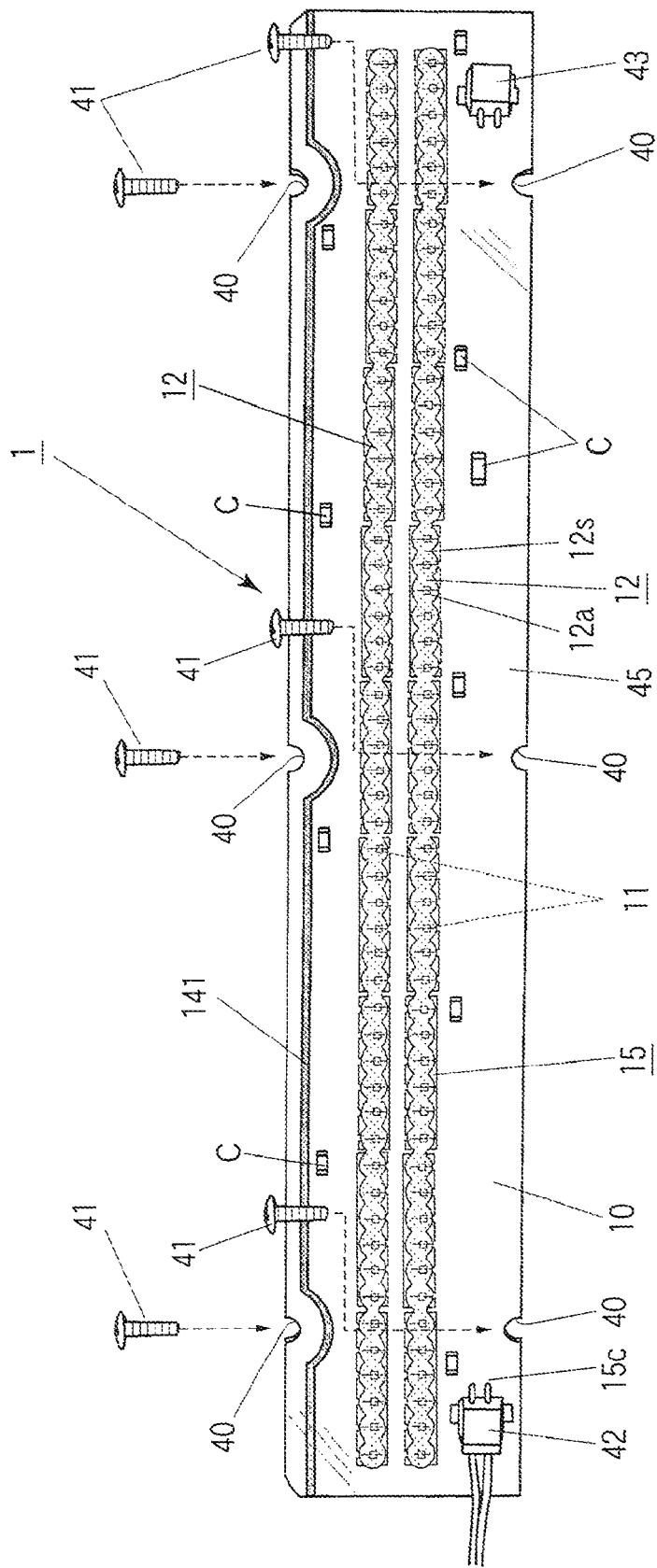
FIG. 1 is a plan view of a light-emitting apparatus of a first embodiment viewed from an obverse side thereof.

In general, according to one embodiment, a low-cost, high luminous efficacy light-emitting apparatus with a plurality of light-emitting devices and a luminaire equipped with the light-emitting apparatus are provided. This light-emitting apparatus reduces variations in volumes of phosphor layers for the individual light-emitting devices and homogenizes emitted light.

The light-emitting apparatus is provided with a substrate, a plurality of light-emitting devices, and a phosphor layer. The plurality of light-emitting devices are mounted on the substrate. The phosphor layer is formed of a translucent resin containing a phosphor and includes a phosphor portion that is formed in a convex shape and covers a predetermined number of the light-emitting device. Bases of the adjacent phosphor portions are formed by being linked with one another.

In this specification, technical meanings and interpretations of each term are defined below unless otherwise specified particularly.

The substrate may be formed of a glass epoxy resin, a ceramics material, or other synthetic resin materials. Using a substrate including a metallic base plate as the substrate is not precluded to increase heat radiation of each of the light-emitting devices. Such a substrate is formed by laminating an insulating layer on one surface of a metallic base plate such as aluminum having a high thermal conductivity and excellent heat radiation performance. Since a shape of the substrate is not restricted, a rectangular, square, or circular shape may be used.

The light-emitting device is a solid-state light-emitting device such as a light-emitting diode (LED). The number of light-emitting devices mounted on the substrate is not restricted as long as it is two or more. When the light-emitting device is an LED, a face-up type or a flip-chip type is used.

A synthetic resin of a translucent silicone resin 10, containing an appropriate amount of phosphor is used as the phosphor layer. Yttrium Aluminum Garnet doped with Cerium (YAG:Ce) or the like is used as the phosphor.

The phosphor portion is formed by supplying the translucent silicone resin from a dispenser so that it drips on each of the light-emitting devices. The translucent silicone resin contains the phosphor, of which a viscosity and an amount have been regulated, and while it is not hardened. The phosphor portion covers the light-emitting devices not only one by one, but also two, three, or more of the light-emitting devices together at a time.

In this light-emitting apparatus, the plurality of light-emitting devices are arranged and mounted on the substrate in a manner to form a row and are connected by bonding wires that are formed along the row. Although a thin wire of gold (Ag) is used as the bonding wire, metallic wires other than this may also be used. With this arrangement, it is possible to restrain the bonding wire from breaking or being peeled off.

In this light-emitting apparatus, the plurality of light-emitting devices are arranged and mounted on the substrate in a manner to form a row and are covered by the phosphor layer. An end of the phosphor layer is formed in a spherical shape having substantially a constant radius with the light-emitting device disposed at the end of the row as a center of the spherical shape.

A luminaire according to one embodiment is provided with a case and the light-emitting apparatus described above that is built into the case. The luminaire includes a lighting apparatus for indoor or outdoor use or a light source for a display apparatus.

Figure 10:
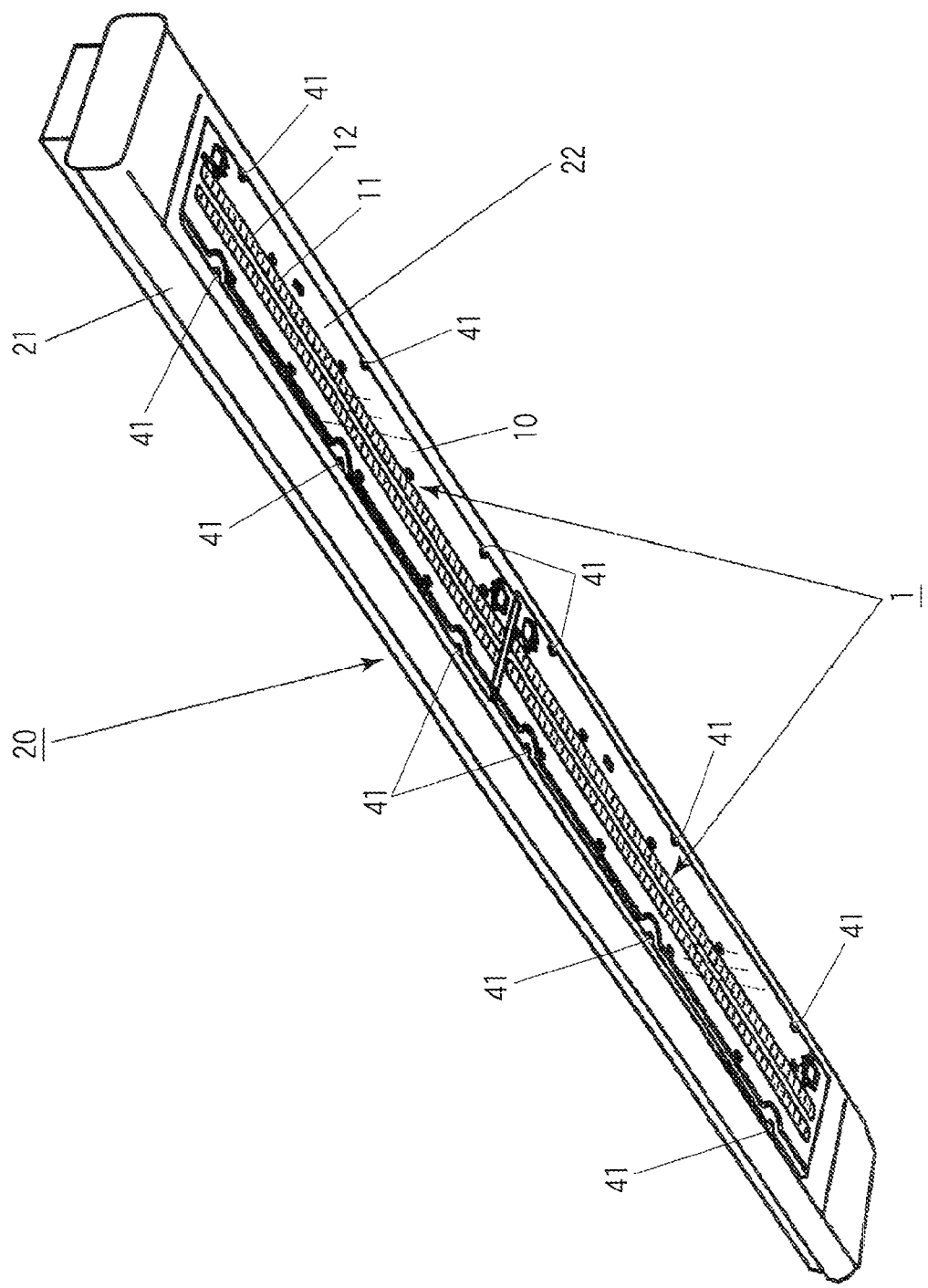
FIG. 10 is a perspective view of a luminaire of a ceiling-direct-mounting type provided with the light-emitting apparatus in FIG. 1.

A first embodiment will be described with reference to FIGS. 1 to 10. FIGS. 1 to 9 illustrate a light-emitting apparatus 1, and FIG. 10 illustrates a luminaire 20 provided with the light-emitting apparatus 1. In each of the drawings, identical components are given the same reference numerals, and an explanation thereof will not be repeated.

As illustrated in FIG. 1, the light-emitting apparatus 1 is provided with a substrate 10, a plurality of light-emitting devices 11, and a phosphor layer 12 that covers each of the light-emitting devices 11. The substrate 10 is made of a material such as a glass epoxy resin and formed in an elongated rectangular shape. A length of the substrate 10 is 230 mm, and a width of the substrate 10 is 35 mm. It is preferable that a thickness of the substrate 10 be 0.5 mm or larger but 1.8 mm or smaller. In this embodiment, the thickness is 1 mm.

The shape of the substrate 10 is not limited to the rectangular shape, and a square or circular shape may be applied. It is also possible to use a ceramics material or other synthetic resin materials as a material for the substrate 10. Further, as the substrate, this embodiment does not preclude using a substrate with a metallic base plate to increase heat radiation of each of the light-emitting devices 11. Such a substrate is formed by laminating an insulating layer on one surface of the metallic base plate such as aluminum having high thermal conductivity and excellent heat radiation performance.

The substrate 10 is provided with a plurality of passing-through portions 40, prepared for fixing the substrate 10, at outer edges of opposing long sides. The passing-through portions 40 are notches in a circular arc shape connected to an outer periphery and are used to fasten the light-emitting apparatus 1 to a case 21 of the luminaire 20 shown in FIG. 10. In this embodiment, a shank of a fixing screw 41, as fixing means, pass through the notches and is screwed into the case 21 of the luminaire 20, and a head of fixing screw 41 is caught in the notch and fastens the substrate 10. With this arrangement, the light-emitting apparatus 1 is fixed to the case 21.

As illustrated in FIG. 1, the substrate 10 is provided with a groove 141 on an obverse side on which a power connector 42, a jointing connector 43, and a capacitor C are mounted. The groove 141 is a trace that has been formed to remove a connection pattern 14 which will be described later. The power connector 42 is connected to a power source. The jointing connector 43 is used to connect the light-emitting apparatuses 1 to one another to form the luminaire 20. The capacitor C is prepared for preventing the light-emitting device 11 from erroneous lighting due to accumulation of noises in a lighting circuit.

As illustrated in FIGS. 2 to 4, 6, and 7, the substrate 10 includes a wiring pattern 15 buried into a resist layer on the obverse side. The wiring pattern 15 includes a mounting pad 15a, a power supply conductor 15b, and a power receiving terminal 15c. The mounting pad 15a carries the plurality of light emitting devices 11, and a plurality of mounting pads 15a are arranged in a longer direction of the substrate 10. The power supply conductor 15b is electrically connected to these mounting pads 15a. The power receiving terminal 15c is provided at an end portion of the power supply conductor 15b and is connected to the power connector 42.

Figure 2:
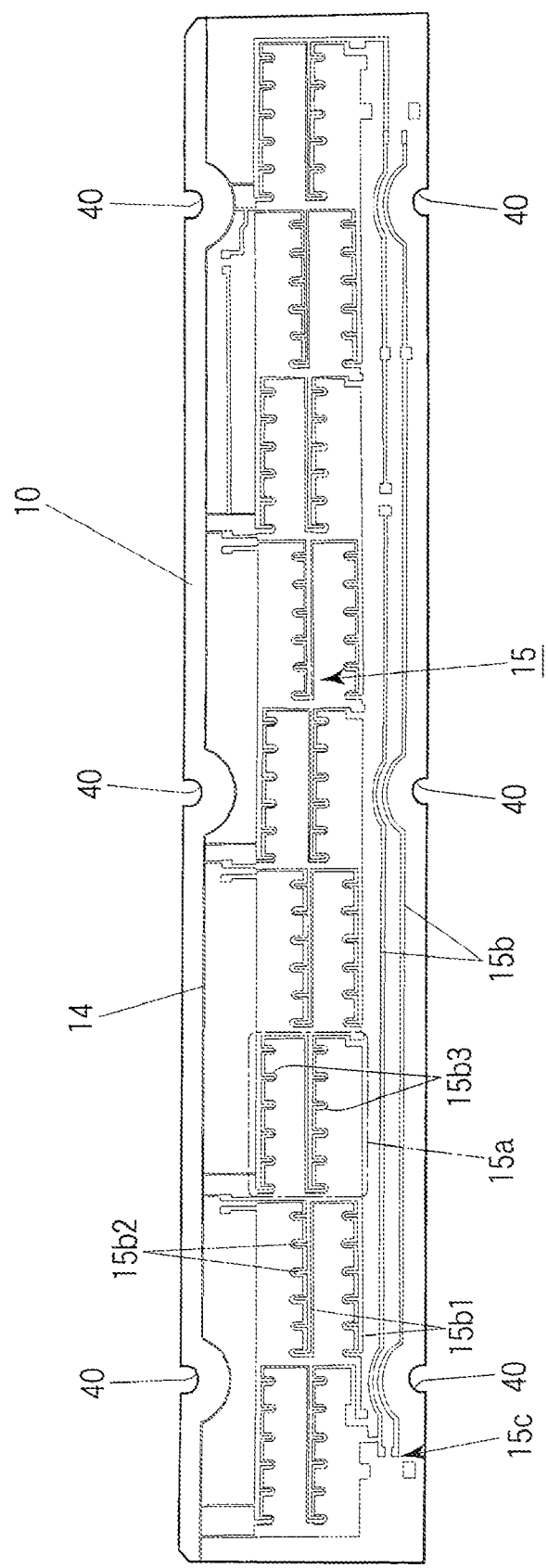
FIG. 2 is a plan view of a wiring pattern and a connection pattern of a substrate of the light-emitting apparatus in FIG. 1.

As illustrated in FIG. 2, each of the mounting pads 15a has substantially a rectangular shape elongated in the longer direction of the substrate 10, and includes two power supply conductors 15b1 having a small width and extending from a short side in the longer direction of the substrate 10. Each of the power supply conductors 15b1 is provided with a plurality of power supplying posts 15b2, e.g., six pieces in this embodiment, which protrude in a direction perpendicular to a direction in which the power supply conductors 15b1 extend.

As illustrated in FIG. 2, the mounting pad 15a, along one of the longer sides and in the center thereof, allows the power supply conductors 15b1 of another of the mounting pads 15a adjacent thereto in the longer direction of the substrate 10 to enter an area of the mounting pad 15a with an insulating gap provided therebetween. Inlet portions 15b3 that individually fit to the power supplying posts 15b2 are also formed in the mounting pad 15a. The mounting pads 15a having such a shape are combined with adjacent ones in an alternately reversed manner around an axis along the longer direction of the substrate 10 and are disposed in a plural number in the longer direction to form the wiring pattern 15.

Figure 6:
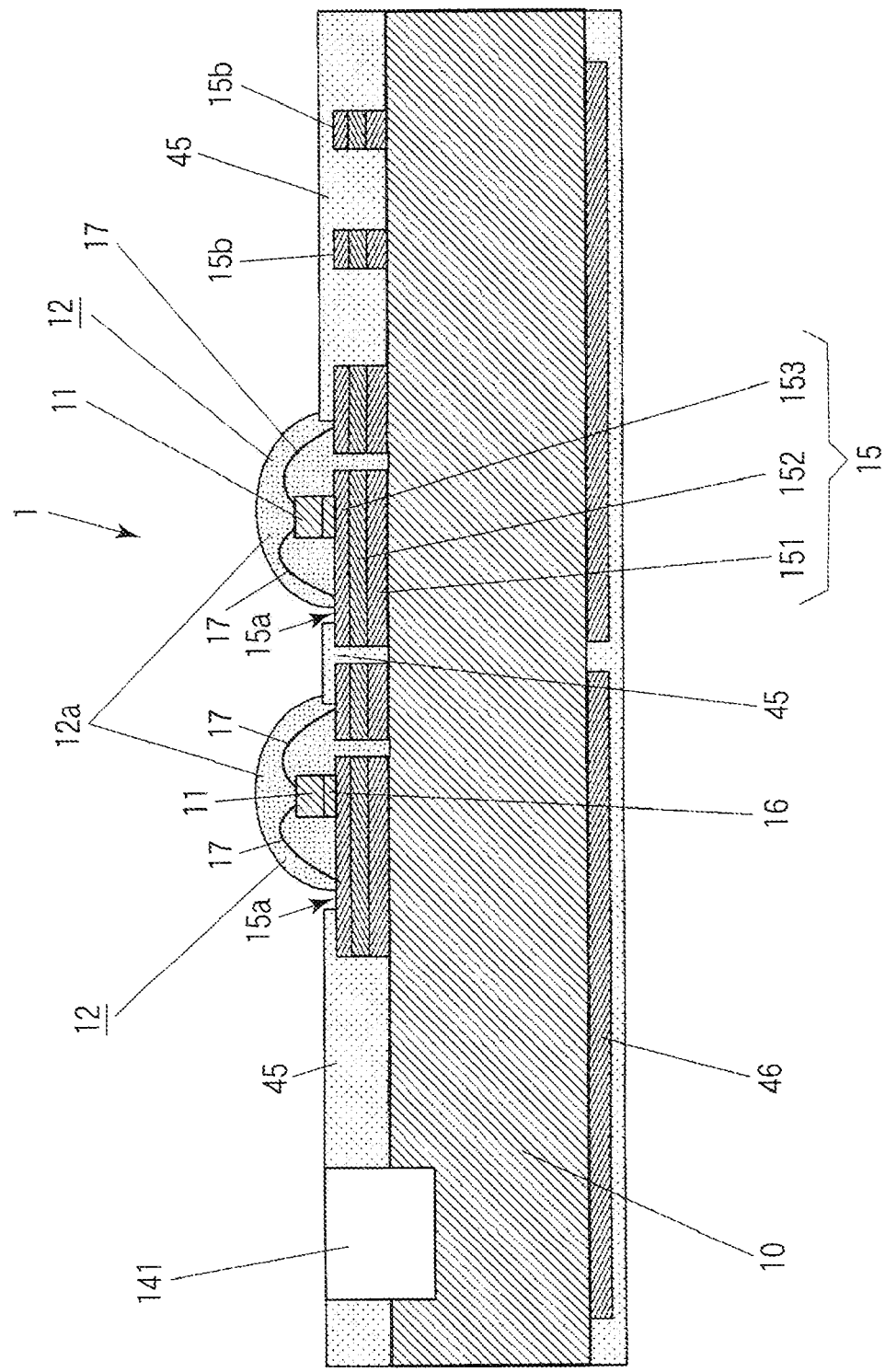
FIG. 6 is a schematic cross-sectional view taken along a line F6-F6 in FIG. 4.
Figure 7:
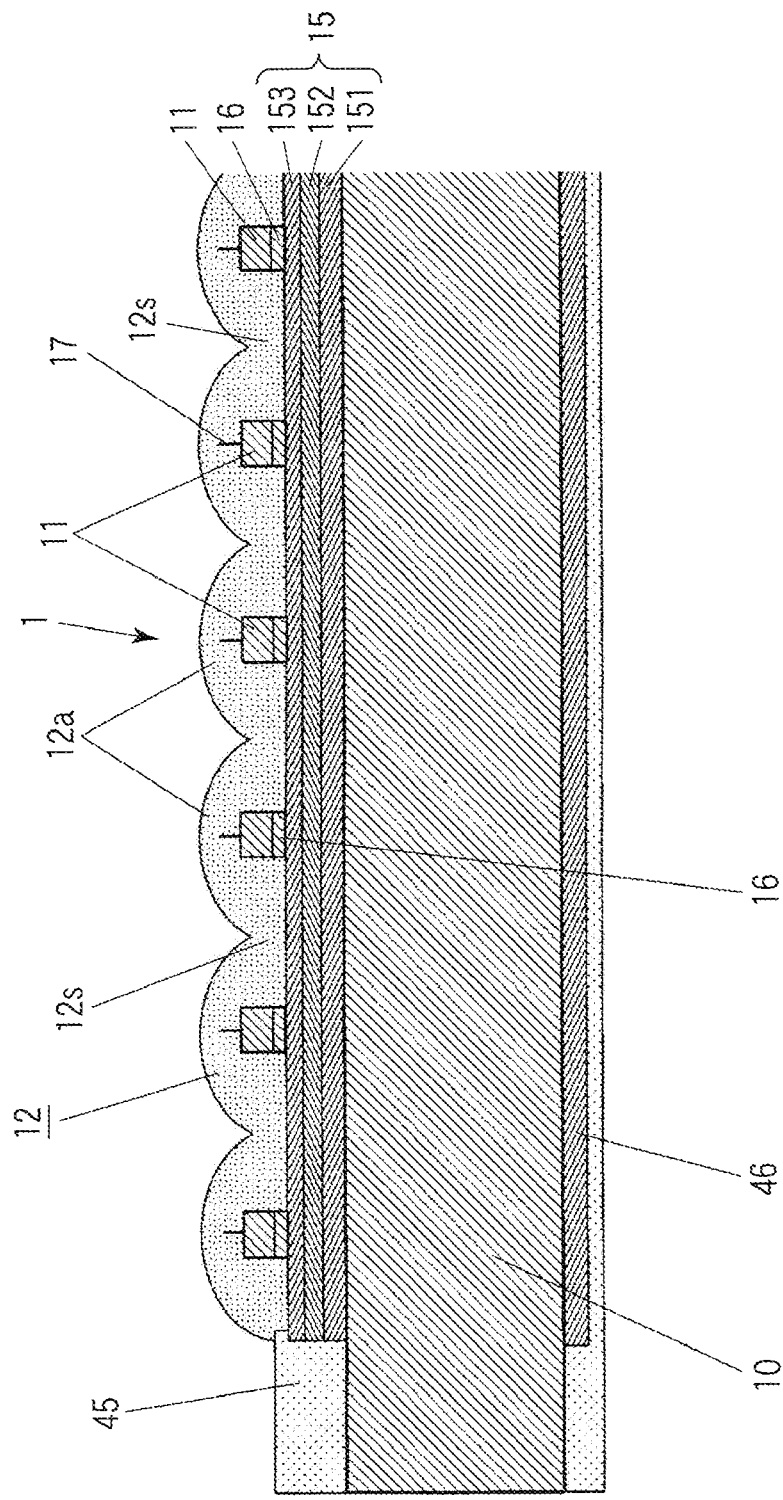
FIG. 7 is a schematic cross-sectional view taken along a line F7-F7 in FIG. 4.
Figure 8:
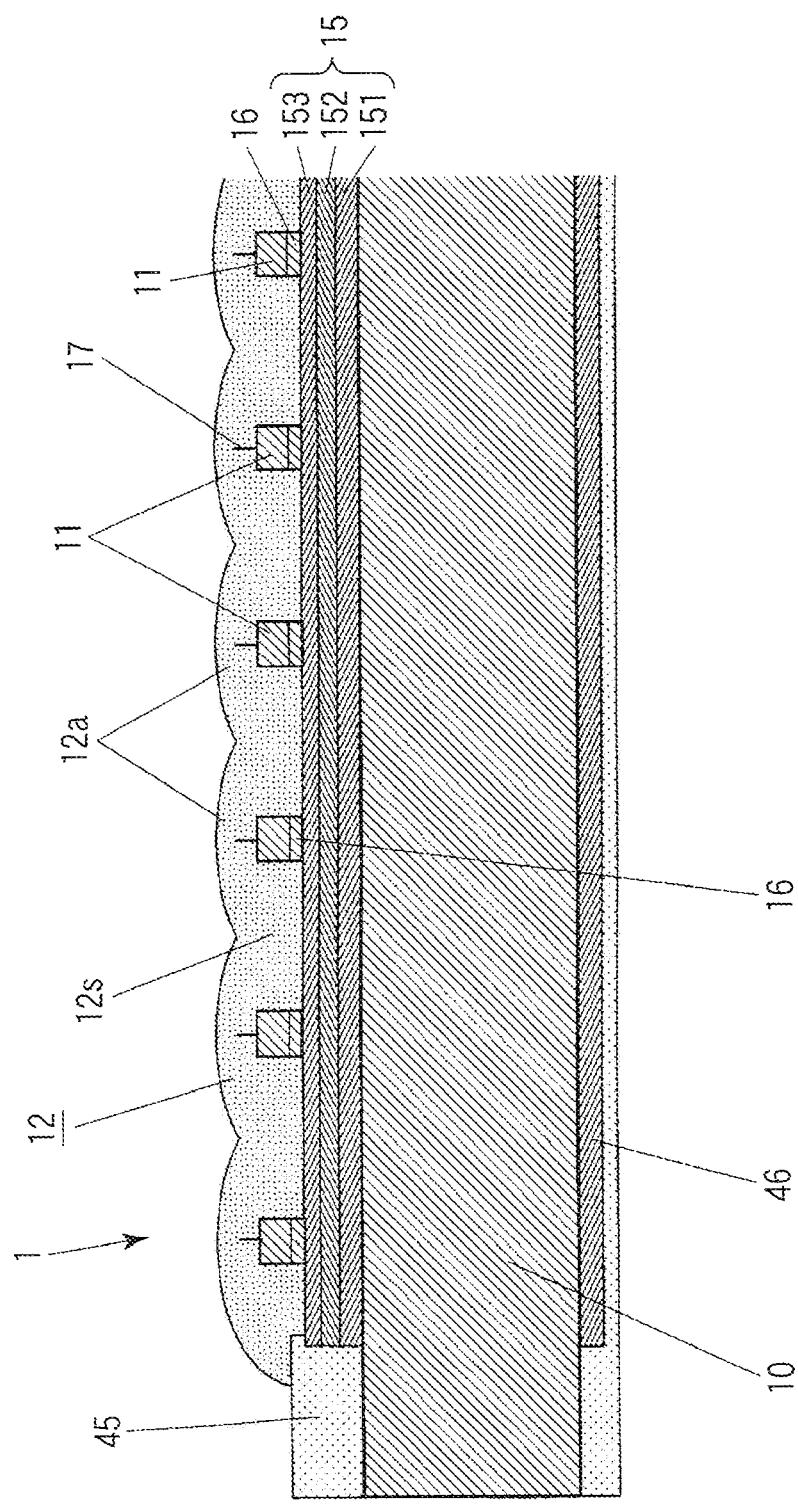
FIG. 8 is a schematic cross-sectional view of a modification of the light-emitting apparatus according to the first embodiment corresponding to FIG. 7.
Figure 9:
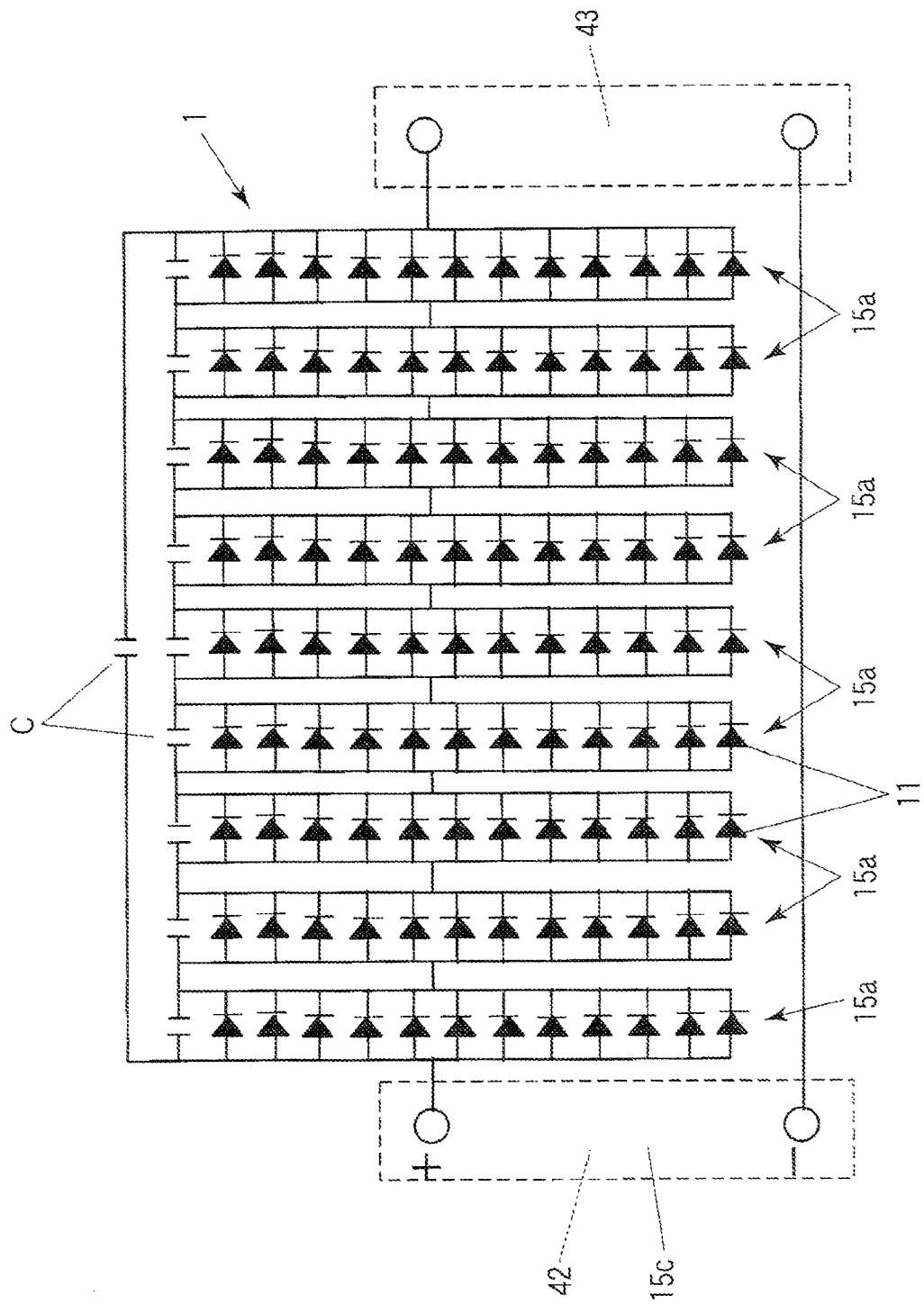
FIG. 9 is a wiring diagram of light-emitting devices of the light-emitting apparatus in FIG. 1.

As illustrated in FIGS. 6 and 7, the wiring pattern 15 and the connection pattern 14 have, on the obverse side of the substrate 10, a three-layer structure comprising, from a lowermost layer, a first layer 151 formed of copper (Cu), a second layer 152 formed of nickel (Ni), and a third layer 153 formed of silver (Ag) having a high reflectance, individually formed by electrolytic plating. Since the third layer 153 of the wiring pattern 15, that is, silver formed as a surface by electrolytic plating, has a high reflectance, it functions as a reflecting layer.

According to this embodiment, a whole ray reflectance of the third layer 153 is 90%. A thickness of nickel (Ni) of the second layer 152 is 5 μm or more, and a thickness of silver (Ag) of the third layer is 1 μm or more, both of which are formed by electrolytic plating. By arranging the thicknesses of the layers as described above, the layer thicknesses are formed uniformly, and thus a uniform reflectance can be obtained.

Figure 3:
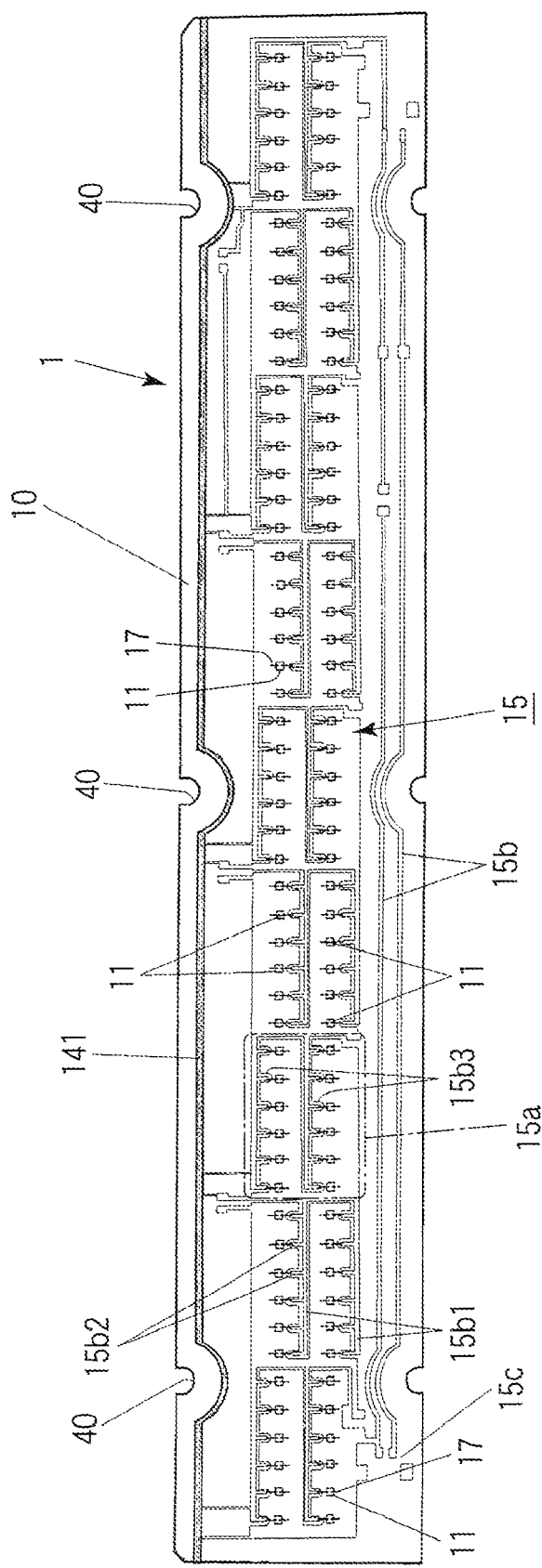
FIG. 3 is a plan view of a state in which light-emitting devices are mounted on the substrate in FIG. 2 from which the connection pattern is removed.

A white resist layer 45 having a high reflectance is laminated on almost the entire obverse side of the substrate 10 excluding mounting areas where the light-emitting devices 11 are mounted and mounting portions where components are mounted. For convenience of explanation, FIGS. 2 to 4 illustrate the wiring pattern 15 and the like. However, the wiring pattern 15 and the like are difficult to observe visually when the white resist layer 45 is actually formed.

Each of the light-emitting devices 11 is a bare tip of an LED. The bare tip of an LED that emits blue light is used so that a light-emitting portion of the light-emitting apparatus 1 is made to output light of white color. The light-emitting devices 11 are bonded onto the mounting pad 15a with a silicon resin based insulating adhesive 16 as illustrated in FIGS. 6 and 7.

In this embodiment, the light-emitting device 11 is a bare tip of Indium-Gallium-Nitride series (InGaN) and has a structure in which a light-emitting layer is laminated on a translucent sapphire substrate. The light-emitting layer is formed by laminating sequentially an n-type nitride semiconductor layer, an InGaN layer, and a p-type nitride semiconductor layer. Electrodes for supplying current to the light-emitting layer are formed of a positive electrode that is formed by a p-type electrode pad on the p-type nitride semiconductor layer and a negative electrode that is formed by an n-type electrode pad on the n-type nitride semiconductor layer. As illustrated in FIGS. 3 and 6, these electrodes are electrically connected to the wiring pattern 15 by bonding wires 17. The bonding wire 17 is a thin wire made of gold (Au) and is connected through a bump formed of gold (Au) as a principal component to enhance a packaging strength and reduce damage to the light-emitting device 11.

As illustrated in FIG. 3 as a representative drawing, the plurality of light-emitting devices 11 are made to adhere to the mounting pad 15a in a manner to individually correspond to the power supplying posts 15b2 of the mounting pad 15a. In the first embodiment, the light-emitting devices 11 mounted on one of the mounting pads 15a are twelve in total including six that are provided in a manner to correspond to the power supplying posts 15b2 in the center and another six that are provided in a manner to correspond to the power supplying posts 15b2 along the long side. The light-emitting devices 11 are provided in a similar manner to each of the plurality of mounting pads 15a that are arranged in the longer direction of the substrate 10, and the light-emitting devices 11 of each of the mounting pads 15a are arranged to form a plurality of rows. In the first embodiment, two rows of the light-emitting devices 11 are formed in the longer direction.

Since the power supplying posts 15b2 of the mounting pad 15a enter the inlet portions 15b3 of the adjacent mounting pad 15a, the light-emitting devices 11 are arranged in the center of the mounting pad 15a. Accordingly, heat generated by the light-emitting devices 11 is effectively radiated by way of the mounting pad 15a.

The light-emitting devices 11 that are arranged in this way are supplied with power by being sequentially connected from an anode of the power source through the mounting pad 15a and the bonding wire 17 to the positive electrode of the light-emitting device 11, and then connected from the negative electrode of the light-emitting device 11 through the bonding wire 17 to the power supplying post 15b2 of the adjacent mounting pad 15a. In the first embodiment, the bonding wire 17 is wired in a direction perpendicular to a direction in which the light-emitting devices 11 form the row.

The light-emitting apparatus 1 including the light-emitting devices 11 that are connected as described above forms a circuit illustrated in FIG. 9. According to this wiring diagram, twelve light-emitting devices 11 arranged on one of the mounting pads 15a are connected in parallel to one another, and nine mounting pads 15a are connected in series to one another. Further, the capacitor C that is inserted to prevent the erroneous lighting includes each first capacitor that is connected in parallel between the electrodes of each of the parallel circuits formed by each of the mounting pads 15a and a second capacitor that is connected in parallel between the electrodes of the serial circuit that is formed by all of the mounting pads 15a.

The phosphor layer 12 is made of a translucent synthetic resin, e.g., a translucent silicone resin in the first embodiment, and includes an appropriate amount of a phosphor such as YAG:Ce. The phosphor layer 12 is formed of a plurality of phosphor portions, and is formed of a collective form of phosphor portions 12a that respectively cover the individual light-emitting devices 11, as illustrated in FIGS. 1, 4, 6, and 7 in this embodiment. As illustrated in FIGS. 6 and 7, each of the phosphor portions 12a forms a dome-like convex shape, and bases of the adjacent phosphor portions 12a overlap each other and form a continuous portion 12s as illustrated in FIG. 7. As a result of this, as illustrated in FIGS. 1 and 4, the phosphor portions 12a of the light-emitting devices 11 that form one row of the light-emitting devices are strung together like beads to thereby form one phosphor layer 12. In the case of the first embodiment, the phosphor layer 12 is formed in two rows in the longer direction of the substrate 10, and covers and seals each of the light-emitting devices 11 and each of the bonding wires 17.

The phosphor is excited by light emitted by the light-emitting device 11 and emits light of a specific color different from that of the light emitted by the light-emitting device 11. In this embodiment, since the light-emitting device 11 emits blue light, a yellow phosphor that emits yellow light which is a complementary color to the blue light is used as a phosphor to be contained in the phosphor layer so that white light is emitted as output light of the light-emitting apparatus 1.

The phosphor layer 12 is applied, while it is not hardened, to each of the light-emitting devices 11 and each of the bonding wires 17 and is hardened thereafter through a heating process or leaving it intact for a predetermined period. In the first embodiment, regulated amount of a translucent silicone resin material having a regulated viscosity and containing a phosphor, while it is not hardened, is supplied from a dispenser so that it drips in a manner corresponding to each of the light-emitting devices 11 and each of the bonding wires 17 to thereby form the phosphor portions 12a. The translucent silicone resin material thus dripped forms a dome-like shape as illustrated in FIG. 7. The bases of the translucent silicone resin material spread toward the outer peripheral direction by its fluidity. The continuous portion 12s is formed by the bases of the adjacent phosphor portions 12a that are linked together. Hence, the adjacent phosphor portions 12a are fused together and hardened integrally by the continuous portion 12s.

The continuous portion 12s may be formed in such a way that the translucent silicone resin material is dripped so that adjacent phosphor portions 12a overlap each other, and thereafter the area of the continuous portion 12s further expands as the resin material spreads. Alternatively, the continuous portion 12s may be formed in such a way that, first, the continuous portion 12s is not formed when the translucent silicone resin material is dripped but is formed later as the resin material spreads. The shape of the continuous portion 12s can be designed by adjusting the viscosity or an amount of the translucent silicone resin material to be supplied.

The area size of the continuous portion 12s between the bases of the domes of the adjacent phosphor portions 12a is regulated by adjusting the viscosity or the amount to be supplied of the translucent silicone resin material. As represented by a modification example illustrated in FIG. 8, the area of the continuous portion 12s may be formed larger than the continuous portion 12s illustrated in FIG. 7.

In the first embodiment, the description has been given of a case of the phosphor portion where the light-emitting devices 11 are individually covered by the phosphor portions 12a having a circular dome-like shape. Alternatively, the phosphor portion 12a may be formed by collectively covering two or more of the light-emitting devices 11 together. Here, the method to form the phosphor layer 12 by the phosphor portions 12a is not restricted to the forming methods as described above, but other methods may be applied as long as the bases of the phosphor portions 12a are formed in a continuous manner.

Figure 5:
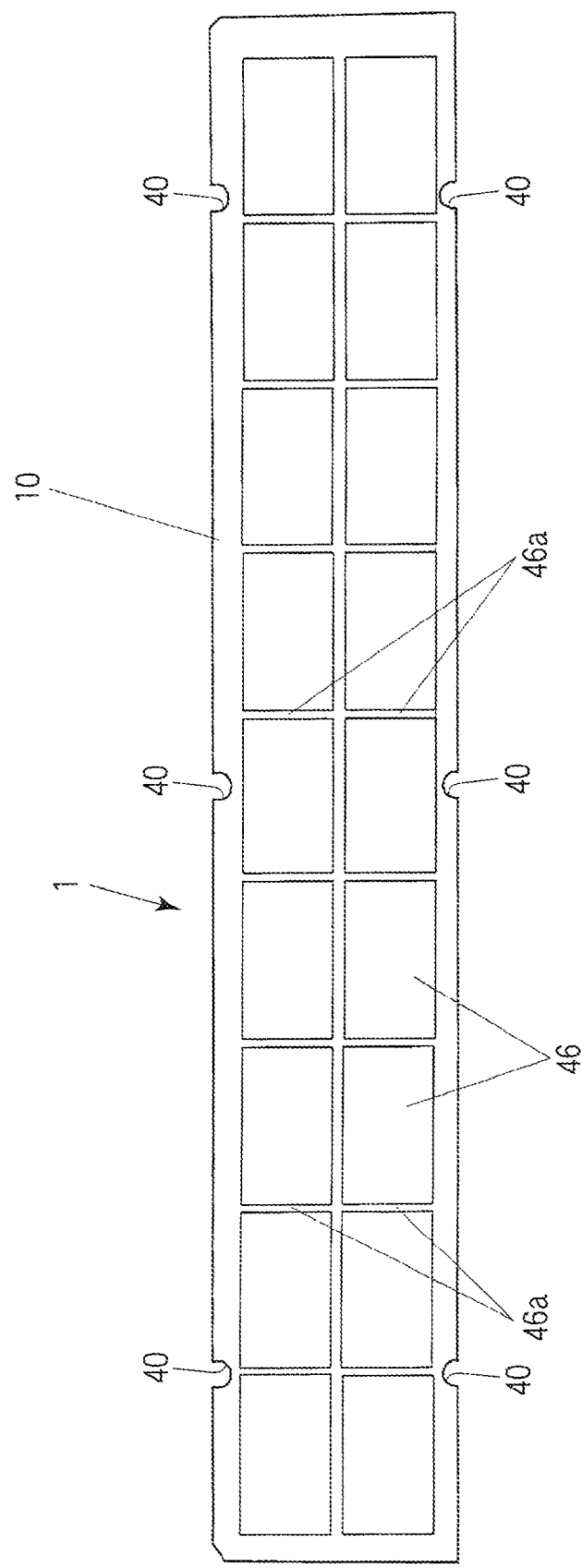
FIG. 5 is a plan view of a rear side of the substrate of the light-emitting apparatus in FIG. 1.

As illustrated in FIGS. 5 to 7, the substrate 10 is provided with a pattern of copper foil 46 for heat radiation which is formed on an entire surface of a reverse side. This pattern includes 18 blocks in a matrix shape that are resulted from dividing the substrate 10 into two in a width direction and into nine in the longer direction so that the pattern corresponds to the mounting pads 15a on the obverse side.

Since the substrate 10 is provided with the copper foil 46, the heat generated by the light-emitting devices 11 are dispersed uniformly through the substrate 10 in its entirety. This makes a radiation performance of the substrate 10 stable. As illustrated in FIG. 5, since discontinuous zones 46a where the copper foil 46 is not formed are present in a direction perpendicular to the longer direction of the substrate 10, warpage or deformation caused in the substrate 10 by heat is suppressed. As illustrated in FIGS. 6 and 7, the substrate 10 includes a resist layer covering the copper foil 46.

Next, referring to FIGS. 2 to 4, a description will be given of an outline of a manufacturing process of the light-emitting apparatus 1 that is arranged as described above.

First, as illustrated in FIG. 2, the wiring pattern 15 and the connection pattern 14 are formed on the obverse side of the substrate 10. The wiring pattern 15 and the connection pattern 14 have a three-layer structure. The wiring pattern 15 functions as a power supplying path for supplying power to each of the light-emitting devices 11. The connection pattern 14 functions as a connection path to make each of the mounting pads 15a equipotential when nickel (Ni) of the second layer 152 and silver (Ag) of the third layer 153 are plated on the pattern of copper (Cu) of the first layer 151 by electrolytic plating.

In a process of faulting the wiring pattern 15 and the connection pattern 14, the copper (Cu) pattern is formed, as the first layer 151, on the surface of the substrate 10. Subsequently, nickel (Ni) as the second layer 152 and silver (Ag) as the third layer 153 are plated sequentially by electrolytic plating.

As illustrated in FIG. 3, the connection pattern 14 is trimmed away by a router, a trimmer, or the like from the obverse side of the substrate 10 on which the wiring pattern 15 and the connection pattern 14 are formed. As a result, the electrical connection among the mounting pads 15a is cut off. The groove 141, which is linear and rectangularly recessed in the longer direction excluding portions for circumventing the penetration portions 40, is formed on the obverse side of the substrate 10 as a trace mark resulted from trimming off the connection pattern 14.

When the wiring pattern 15 is formed, the light-emitting devices 11 are mounted on the mounting pads 15a in a manner to form a row of the light-emitting devices. As illustrated in FIG. 4, the light-emitting devices 11 thus mounted are individually covered by the phosphor portions 12a. The phosphor portions 12a form the phosphor layer 12 in a manner to cover the row of the light-emitting devices 11 that are arranged in the longer direction of the substrate 10.

Next, referring to FIG. 10, a description will be given of the luminaire 20 incorporating therein the above-mentioned light-emitting apparatus 1 that is faced downward. FIG. 10 illustrates the luminaire 20 that is a direct-mounting type and used by being mounted to a ceiling. The luminaire 20 is provided with a case 21 having an elongated and substantially rectangular parallelepiped shape. The case 21 includes two or more of the light-emitting apparatuses 1, e.g., two light-emitting apparatuses 1 that are connected linearly in this embodiment. A power supply unit provided with a power circuit is assembled in the case 21. A front cover 22 having diffuseness is attached to an opening portion opened downwardly of the case 21.

The light-emitting apparatus 1 arranged as described above will be further explained. The light-emitting devices 11 are lit all together, when the light-emitting apparatus 1 is energized by the power circuit. The light output from the light-emitting device 11 excites the phosphor in the phosphor layer 12 and causes the phosphor to emit light, when the light is emitted by passing through the phosphor layer 12. Since the output light from the light-emitting device 11 and the excited light from the phosphor layer 12 are combined together, white light is created. Therefore, the light-emitting apparatus 1 is used as a surface light source emitting white light.

In this case, since the phosphor layer 12 is formed of the phosphor portions 12a having a dome-like shape, and the light-emitting device 11 is arranged in the center of the phosphor portion 12a, light output from the light-emitting device 11 is restrained from making total reflection inside the interface of the phosphor portion 12a. As a result, the light-emitting apparatus 1 suppresses a drop in luminous efficacy caused by a reflection loss.

Further, the adjacent phosphor portions 12a are continuous through the bases. Since the bases of the phosphor portions 12a are mixed with each other in the continuous portion 12s, variations in volumes of the phosphor portions 12a are averaged. Since external shapes of the phosphor portions 12a are averaged, variations in light output power and luminescent color from the respective light-emitting devices 11 are alleviated. For these reasons, the light emitted by the light-emitting apparatus 1 becomes homogeneous.

In the first embodiment, the mounting pad 15a functions as a heat spreader that diffuses heat generated by each of the light-emitting devices 11 while the light-emitting devices 11 emit light. When the light-emitting apparatus 1 emits light, light traveling to the substrate 10 among the light emitted from the light-emitting device 11 is almost entirely reflected by the reflecting layer formed in the surface layer of the mounting pad 15a to a direction in which the light is utilized. The light traveling in a direction along the substrate 10 among the light emitted from the light-emitting devices 11 is reflected by a surface of the white resist layer 45 having a high reflectance and emitted toward a front side. This means that the light-extraction efficiency of this light-emitting apparatus 1 is excellent.

As described above, according to this embodiment, the phosphor layer 12 covers the light-emitting devices 11 individually through the phosphor portions 12a having a dome-like shape. This arrangement prevents the manufacturing cost of the light-emitting apparatus 1 from rising and the luminous efficacy from lowering as well. Further, the adjacent phosphor portions 12a of the light-emitting apparatus 1 are formed in a continuous manner. Since variations in the volumes of the phosphor portions 12a are averaged, the light emitted by the light-emitting apparatus 1 becomes homogeneous. The light emitted from the luminaire 20 equipped with the light-emitting apparatus 1 becomes stable.

Figure 11:
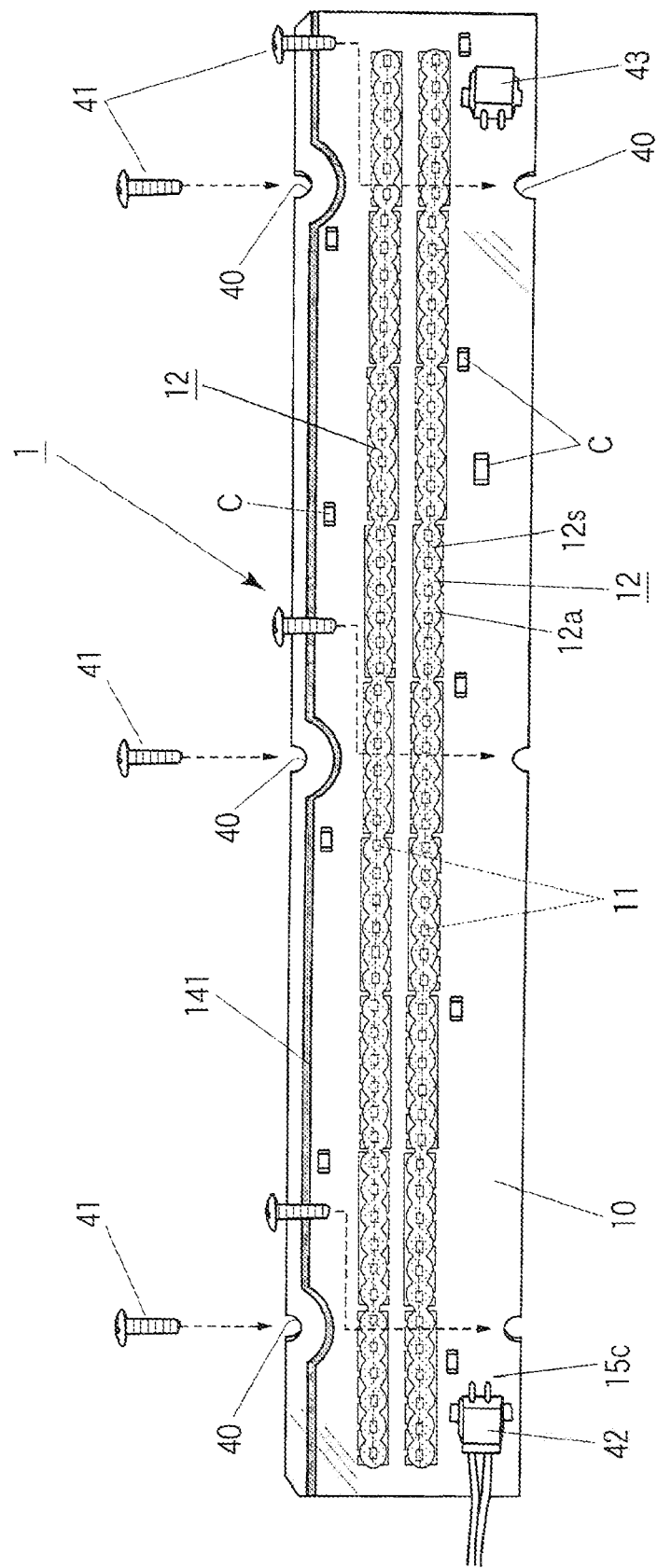
FIG. 11 is a plan view of a light-emitting apparatus of a second embodiment viewed from an obverse side thereof.

A second embodiment will be described with reference to FIGS. 11 and 12. In each of the drawings, structures having identical functions with those in the first embodiment are given the same reference numerals, and explanations thereof will not be repeated by assuming that corresponding descriptions in the first embodiment are referred to.

In a light-emitting apparatus 1 according to this embodiment, light-emitting devices 11 are mounted on a substrate 10 in a manner to form a row in a longer direction of the substrate 10, and the light-emitting devices 11 are connected by bonding wires 17 along a direction in which the row extends.

According to the light-emitting apparatus 1 constituted as described above, it is possible to restrain the bonding wire 17 from breaking and a jointing portion from being disconnected. As illustrated in FIG. 6 of the first embodiment, when the bonding wires 17 are connected in a direction perpendicular to a direction in which the row of the light-emitting devices extends, a film thickness of the phosphor layer 12 that covers the bonding wires 17 tends to become smaller in the vicinity of a portion where the bonding wire 17 is connected to the wiring pattern 15. If a stress is applied externally to the portion of the phosphor layer 12 where the thickness is small, the stress is not sufficiently alleviated, and, as a result, the stress is directly exerted upon the bonding wire 17 or the jointing portion. As a result, the bonding wire 17 may be broken, or the jointing portion may come off.

As illustrated in FIG. 12, in the light-emitting apparatus 1 according to the second embodiment, a continuous portion 12s in which bases of the adjacent phosphor portions 12a are continuously formed is formed in the vicinity of a portion where the bonding wire 17 is connected to the wiring pattern 15. Accordingly, a coating thickness of the phosphor layer 12 that is formed outside the bonding wire 17 is large. If a stress is applied externally to that portion, the stress is alleviated, which restrains the bonding wire 17 from breaking or the jointing portion from coming off.

As described above, according to this embodiment, the bonding wire is restrained 17 from breaking, and the jointing portion is restrained from coming off.

A third embodiment will be described with reference to FIG. 13. Structures having identical functions with those in the first embodiment are given the same reference numerals in the drawing, and, explanations thereof will not be repeated by assuming that corresponding descriptions in the first embodiment are referred to.

In a light-emitting apparatus 1 according to the third embodiment, light-emitting devices 11 forming rows adjacent to each other are mounted in positions deviated by a half pitch from each other in a direction along the row. Along with this arrangement, phosphor portions 12a forming adjacent phosphor layers 12 are also deviated in the direction along the row.

In the third embodiment, the phosphor layers 12 are formed in three rows, and the phosphor portions 12a arranged in the center row are individually disposed between constant intervals at which the phosphor portions 12a of adjacent phosphor layers 12 are individually disposed. The phosphor portions 12a are arranged with high density which is a state close to a so-called close packing or triangular type regular arrangement with respect to a substrate having an identical area. If a distance from the light-emitting devices 11 forming a subject row to the light-emitting devices 11 forming an adjacent row is smaller than a distance between the individual light-emitting devices 11 forming the subject row, the phosphor portions 12a are arranged in a form of staggered arrangement or to be connected in a rhombic grid pattern.

Figure 14:
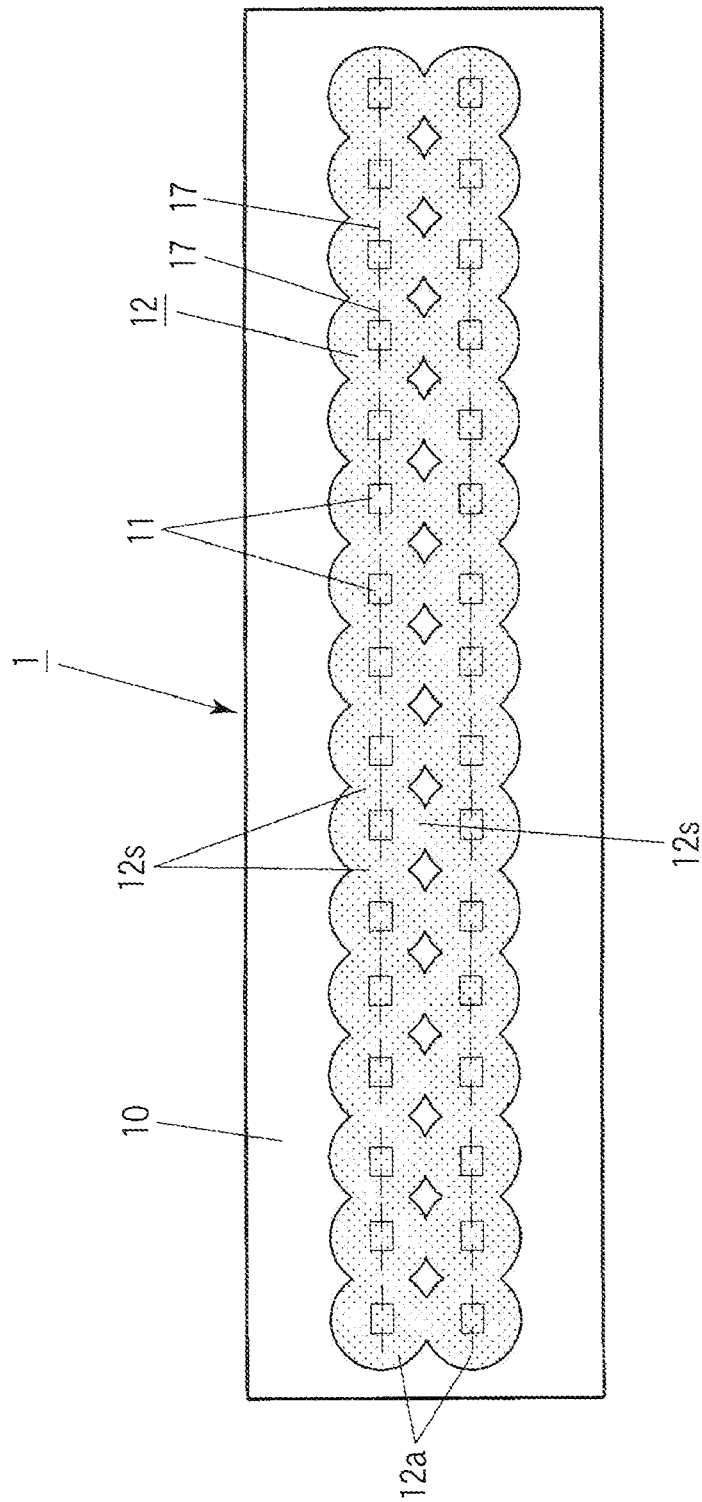
FIG. 14 is a simplified plan view of a light-emitting apparatus of a fourth embodiment.

A fourth embodiment will be described with reference to FIG. 14. Structures having identical functions with those in the first embodiment are given the same reference numerals in the drawing, and explanations thereof will not be repeated by assuming that corresponding descriptions in the first embodiment are referred to.

In a light-emitting apparatus 1 according to the fourth embodiment, a phosphor layer 12 is formed in such a way that bases of phosphor portions 12a, which are formed corresponding to light-emitting devices 11 forming a row along a longer direction of a substrate 10, are continuously formed, and, at the same time, the bases of the phosphor portions 12a of the phosphor layers 12 in adjacent rows are also continuously formed. Continuous portions 12s of each of the phosphor portions 12a become two or more. With this arrangement, volumes of the phosphor portions 12a tend to be averaged, which makes light emitted from the light-emitting apparatus 1, as a whole, homogeneous.

A fifth embodiment will be described with reference to FIGS. 15 to 19. In each of the drawings, structures identical with those in the first embodiment are given the same reference numerals, and explanations thereof will not be repeated by assuming that corresponding descriptions in the first embodiment are referred to.

In a light-emitting apparatus 1 according to the fifth embodiment, a plurality of light-emitting devices 11 are mounted on a substrate 10 such that a plurality of rows extending in a direction perpendicular to a longer direction of the substrate 10 are formed side by side along the longer direction of the substrate, and two or more light-emitting devices 11 are arranged in each of the rows. Each of the rows of the light-emitting devices 11 is covered by a phosphor layer 12. The phosphor layer 12 is formed by continuing phosphor portions 12a that are formed in a manner to individually correspond to the light-emitting devices 11.

Figure 15:
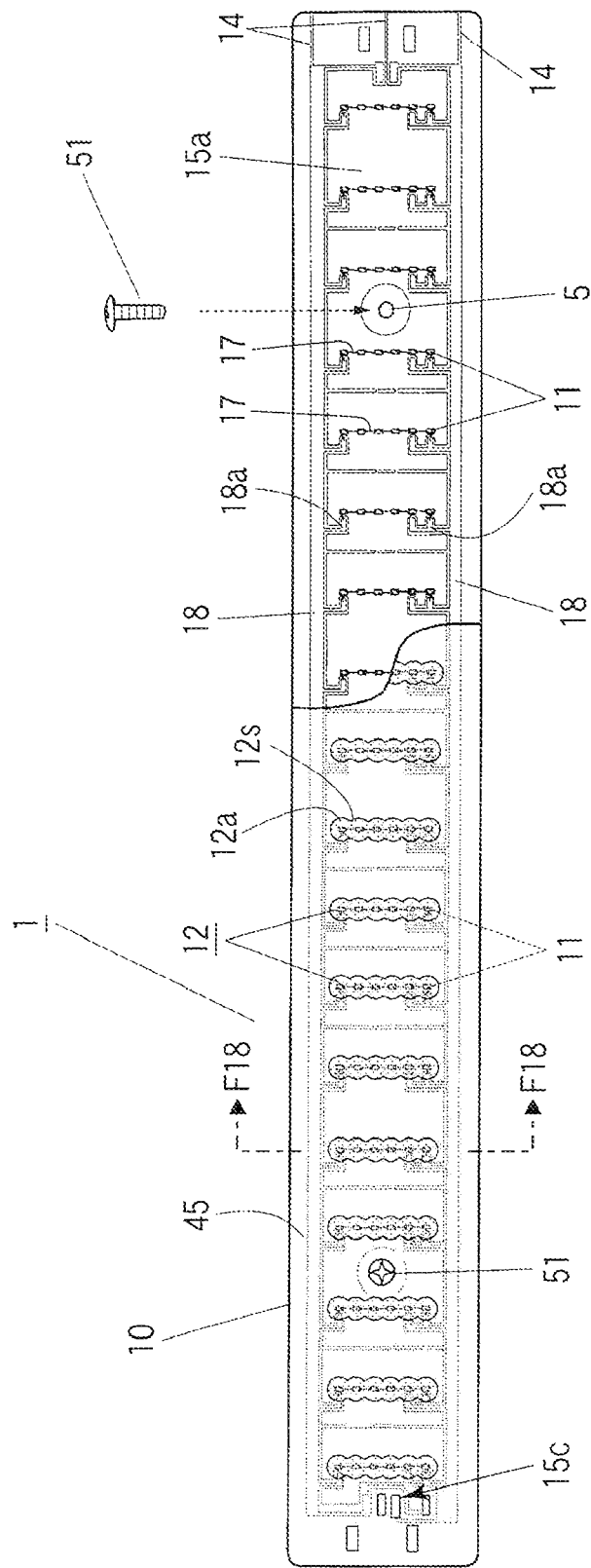
FIG. 15 is a plan view of a light-emitting apparatus of a fifth embodiment where part of the light-emitting apparatus is cut off.

As illustrated in FIG. 15, the light-emitting apparatus 1 is provided with the substrate 10, the light-emitting devices 11, and the phosphor layers 12 covering each of the light-emitting devices 11.

FIG. 15 illustrates the light-emitting apparatus 1 in a manner to partially cut off the phosphor layer 12 and a resist layer 45 on a right side of the illustration as if these components were removed.

Figure 16:
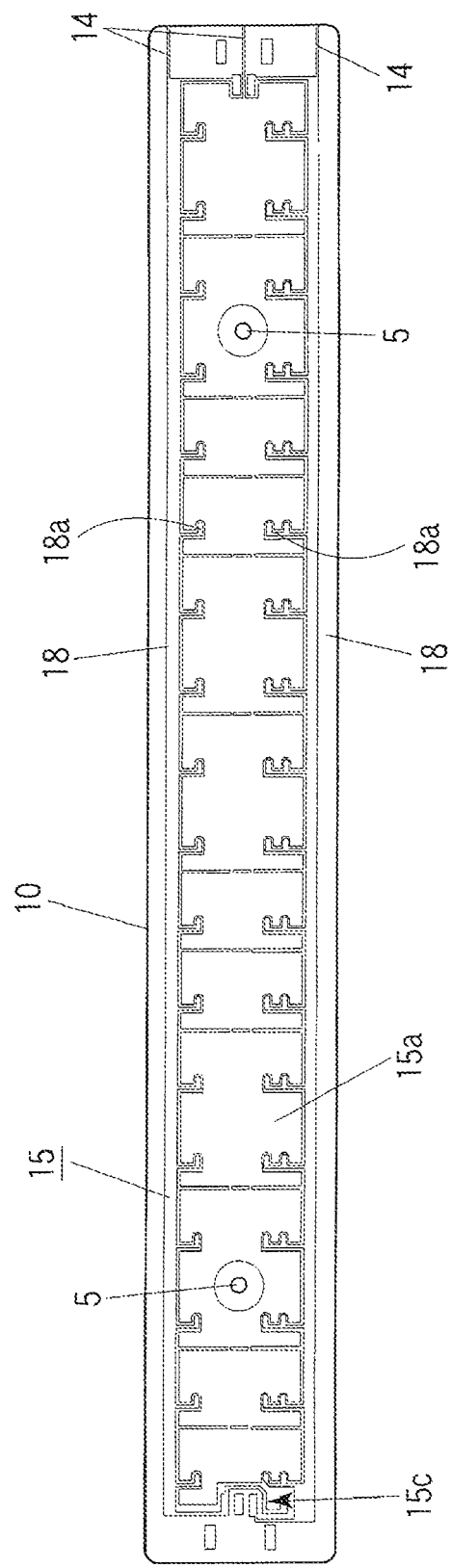
FIG. 16 is a plan view of a wiring pattern and a mounting pad of a substrate of the light-emitting apparatus in FIG. 15.

As illustrated in FIG. 16, a wiring pattern 15 and mounting pads 15a are formed on the substrate 10. The wiring pattern 15 is formed of power supplying conductors 18, power supplying posts 18a, and power receiving terminals 15c. The power supplying conductors 18 are arranged as a pair of positive and negative electrodes linearly in parallel to each other along the longer side of the substrate 10 with a distance provided from each other in a direction of width crossing the longer side of the substrate 10. Each of the power supplying conductors 18 includes a plurality of power supplying posts 18a extending inward.

Referring to FIG. 16, the power supplying posts 18a extending downward from the power supplying conductor 18 illustrated in an upper part of the drawing is formed in an L-shape, and 18 pieces thereof are arranged at regular intervals. Referring to FIG. 16, the power supplying posts 18a extending upward from the power supplying conductor 18 illustrated in a lower part of the drawing is formed in an F-shape, and 18 pieces thereof are arranged at regular intervals in a manner to face the power supplying posts 18a having the L-shape. The power supplying post 18a having the L-shape has one terminal, and the power supplying post 18a having the F-shape has two terminals.

The mounting pads 15a are arranged between the two power supplying conductors 18 and form a plurality of blocks thereof with insulation distances from the power supplying conductors 18 and the power supplying posts 18a. Although the mounting pads 15a are not electrically connected to the light-emitting devices 11, they are connected in a manner to establish electric conductivity for performing electrolytic plating which will be described later.

Figure 17:
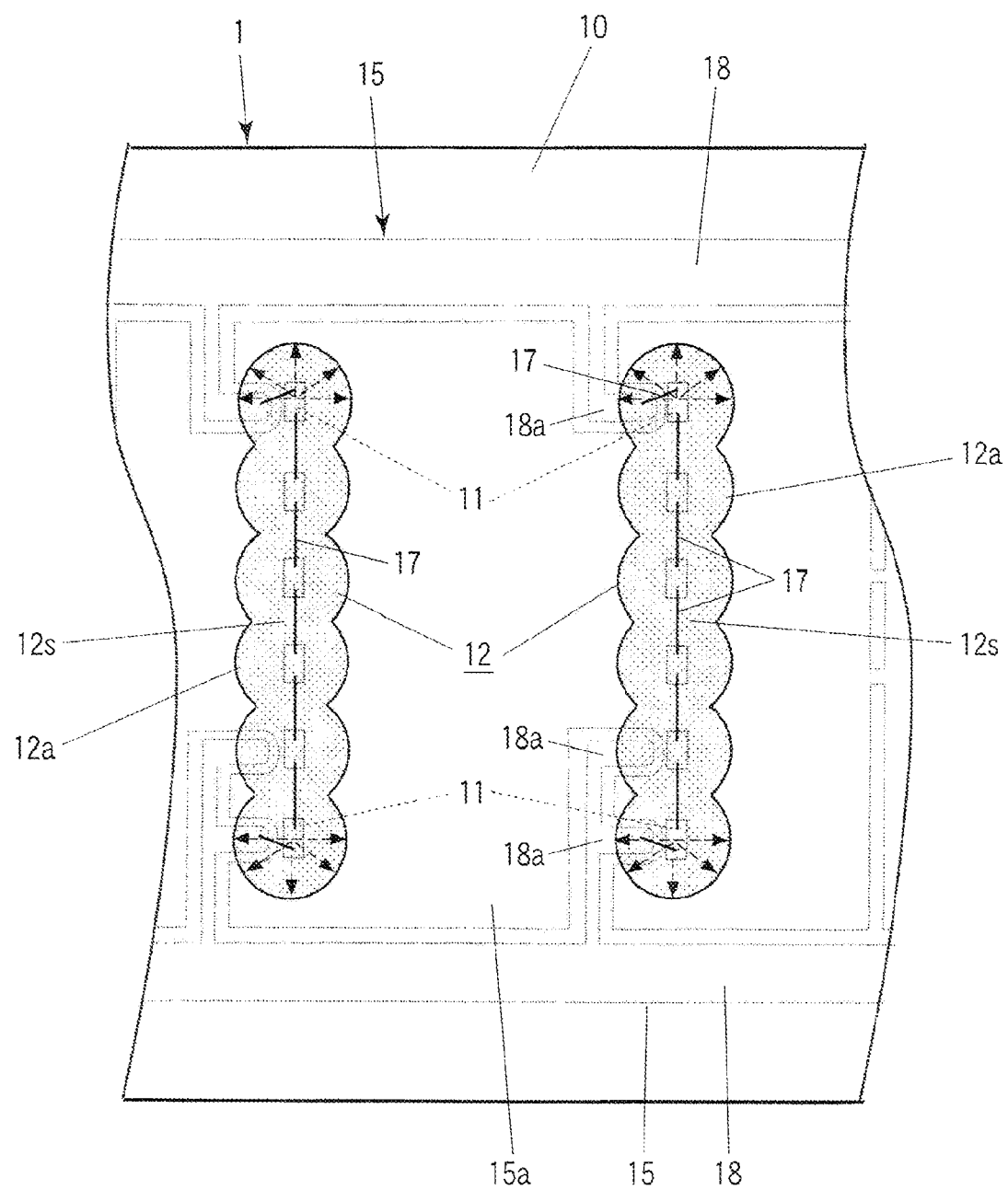
FIG. 17 is a partially enlarged plan view of the light-emitting apparatus in FIG. 15.

As illustrated in FIG. 17, the plurality of light-emitting devices 11 are arranged and mounted on the mounting pads 15a of the substrate 10 in a manner to form rows in a direction perpendicular to the longer direction of the substrate 10. As illustrated in FIG. 15, the plurality of rows of the light-emitting devices 11 are arranged at regular intervals along the longer direction of the substrate 10. Six pieces of the light-emitting devices 11 are arranged at regular intervals between each of the power supplying posts 18a of the power supplying conductor 18 in the upper part of FIGS. 15 and 17 and each of the power supplying posts 18a of the power supplying conductor 18 in the lower part of the drawings. As illustrated in FIG. 15, 18 rows of the light-emitting devices 11 are formed in the longer direction of the substrate 10. This means that the light-emitting devices 11 are arranged in 18 rows each including six pieces.

In each row, individual electrodes of the light-emitting devices 11 are connected by the bonding wires 17 to electrodes with opposite polarities of the individual light-emitting devices 11 arranged adjacent thereto in a direction in which the row extends. As illustrated in FIG. 17, a positive electrode of a light-emitting device 11 disposed midway in the row is connected to a negative electrode of a light-emitting device 11 located on one side next thereto, and a negative electrode of the light-emitting device 11 is connected to a positive electrode of a light-emitting device 11 located next thereto on the other side. This means that the plurality of light-emitting devices 11 forming each row are electrically connected in series. Accordingly, the light-emitting devices 11 of the same row emit light all together when the row is energized.

In FIG. 17, the electrode of the light-emitting device 11 arranged at the top end of each row is connected to a terminal of the upper power supplying post 18a having the L-shape by the bonding wire 17. The electrode of the light-emitting device 11 arranged at the bottom end of each row is connected, by the bonding wire 17, to the lower terminal of two terminals of the power supplying post 18a with the F-shaped located on the lower side.

Here, the row of the light-emitting devices 11 is configured so that the phosphor portions 12a formed individually for the light-emitting devices 11 that constitute the row are connected to one another through the bases thereof to form a single connected phosphor layer 12.

In the light-emitting apparatus 1 according to the fifth embodiment, one row is formed of six pieces of the light-emitting devices 11. When one row is formed of five pieces of the light-emitting devices 11, the electrode of the light-emitting device 11 at the bottom end in FIG. 17 is connected to the upper terminal of two terminals of the power supplying post 18a with the F-shaped located on the lower side. This means that the same substrate 10 can be used regardless of whether the number of the light-emitting, devices 11 is set at five or six.

The light-emitting apparatus 1 including the light-emitting devices 11 that are connected as described above forms a circuit illustrated in FIG. 19. According to this wiring diagram, the light-emitting apparatus 1 is formed by connecting 18 series circuits in parallel. Each of series circuits includes six light-emitting devices 11 connected in series. Individual rows of the light-emitting devices 11 are arranged in parallel electrically to which power is supplied through the wiring pattern 15. With this arrangement, the light emitting apparatus 1 keeps lighting by means of the light-emitting devices 11 of other rows, even if any one of the 18 rows is not energized due to bonding failure or the like.

As illustrated in FIGS. 15 and 16, the substrate 10 includes, between adjacent rows in areas toward the ends thereof, holes 5 piercing through in a thickness direction of the substrate 10. These holes 5 are used to fix the light-emitting apparatus 1 to the case 21 of the luminaire 20 of the first embodiment illustrated in FIG. 10. When the light-emitting apparatus 1 is incorporated into the luminaire 20, fixing screws 51 serving as fixing means are inserted through the holes 5 and screwed into the case 21 of the luminaire 20.

The substrate 10 includes three connection patterns 14 at an end opposite to a side on which the power receiving terminal 15c is arranged. The connection patterns 14 are connected to each of the power supplying conductors 18 and the mounting pads 15a and used when the wiring pattern 15 and the mounting pads 15a are formed by electrolytic plating. To be more specific, the connection patterns 14 function as a connection path to make each of the wiring pattern 15 and the mounting pads 15a equipotential when nickel (Ni) of the second layer and silver (Ag) of the third layer are plated on the pattern of copper (Cu) of the first layer by electrolytic plating.

Figure 18:
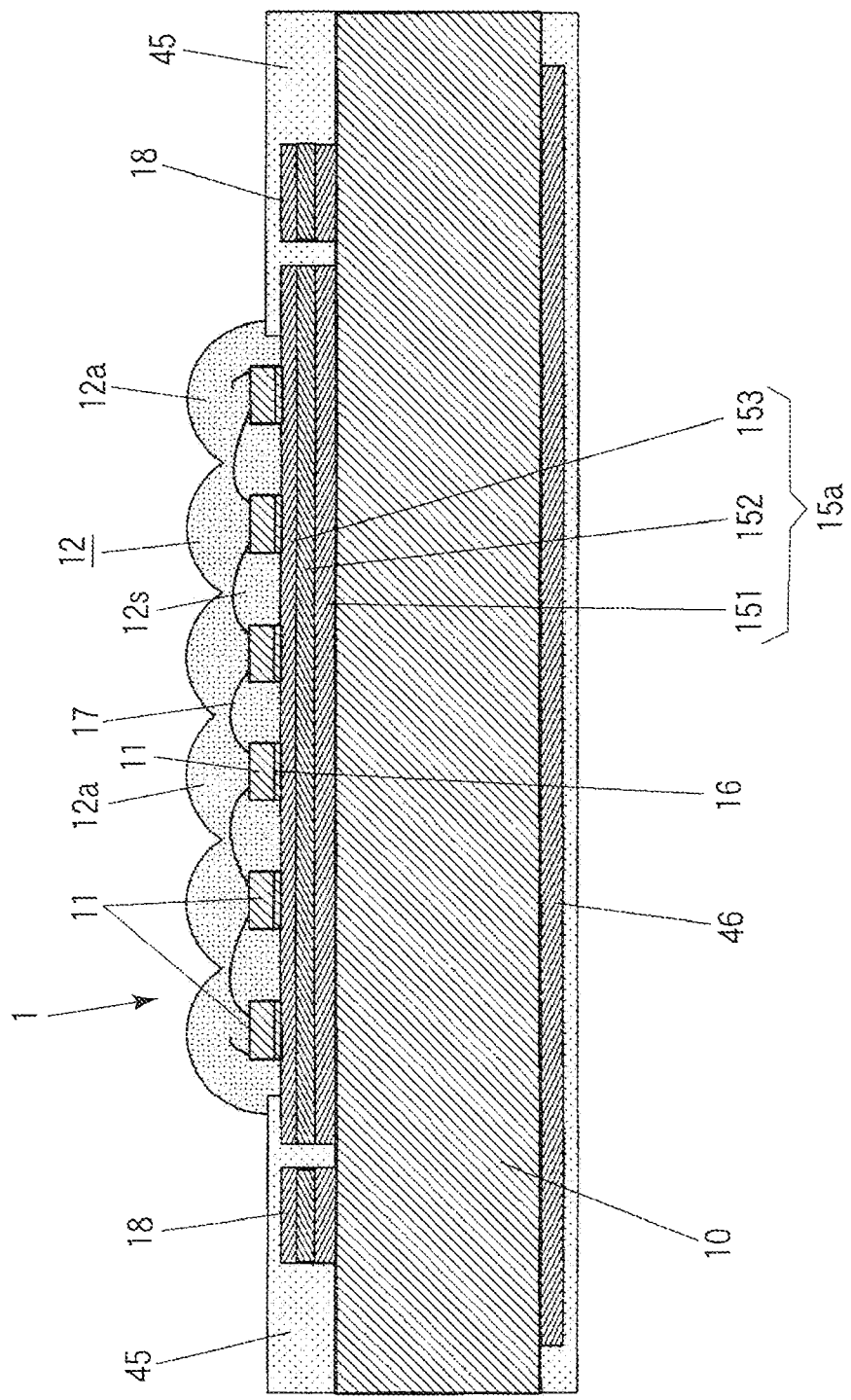
FIG. 18 is a schematic cross-sectional view taken along a line F18-F18 in FIG. 15.

As illustrated in FIGS. 15, 17, and 18, the phosphor layer 12 is made of a translucent synthetic resin, e.g., a translucent silicone resin in the fifth embodiment, and contains an appropriate amount of a phosphor including YAG:Ce as a main component. The phosphor layer 12 is formed of a plurality of phosphor portions 12a that respectively cover the individual light-emitting devices 11. Each of the phosphor portions 12a forms a rounded projection in a dome-like shape. The phosphor portions 12a have, in bases thereof, continuous portions 12s that join the adjacent phosphor portions 12a together. The phosphor layer 12 is formed along a row of the light-emitting devices 11. Therefore, in the fifth embodiment, the phosphor layer 12 is formed for each of 18 rows arranged side by side in the longer direction of the substrate 10, and covers and seals the light-emitting devices 11 and the bonding wires 17 in each of the rows.

In each of the embodiments, an end of the phosphor layer 12 is formed in substantially a spherical shape having the light-emitting device 11 as a center thereof. As illustrated in FIG. 17 as a representative drawing, edges of the both ends of the phosphor layer 12 covering the row of the light-emitting devices 11 are formed in a circular arc shape with the light-emitting device 11 as a center thereof. As indicated by arrows in FIG. 17, since this arrangement makes distances from the light-emitting device 11 disposed at the end of the row and boundary surfaces of the phosphor portion 12a corresponding to the light-emitting device 11 identical to one another, the thickness of the phosphor layer 12 formed for each of the light-emitting devices 11 arranged at the ends of the row becomes uniform.

Accordingly, light output power and luminescent color of the light-emitting device 11 arranged at the end of the row become similar to those of emitted light of the light-emitting device 11 arranged in the middle of the row. As a result, variations in the light output power and the luminescent color of the light-emitting devices 11 in the row are reduced and become homogeneous.

If it is assumed that the both ends of the phosphor layer 12 are formed in a square shape, the thickness of the phosphor layer 12 for the light-emitting device 11 arranged at the end of the row largely differs according to a direction of light output, and the light output power and the luminescent color of such a light-emitting device 11 may be different from those of the light-emitting device 11 arranged in the middle of the row.

According to the fifth embodiment, the plurality of light-emitting devices 11 form a row on the mounting pads 15a of the substrate 10 in a direction perpendicular to the longer direction of the substrate 10. Accordingly, the light-emitting apparatus 1 according to the fifth embodiment provides, in addition to the effect provided by the first embodiment, an effect by which a desired output can be set by selecting the number of rows of the light-emitting devices 11.

The present invention is not limited to the specific details of each of the embodiments shown and described above. Accordingly, various modifications may be made without departing from the spirit or scope of the invention. For example, in the embodiments described above, each of the light-emitting devices 11 is covered by each of the phosphor portions 12a. However, each of the phosphor portions 12a may be formed to cover a plurality of the light-emitting devices 11 together.

The light-emitting apparatus according to the embodiments described above and the luminaire provided with the light-emitting apparatus can be used as a lighting apparatus for indoor or outdoor use or a light source for a display apparatus.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A light-emitting apparatus comprising:
   a substrate comprising a wiring pattern and a white reflecting layer, the wiring pattern including a plurality of mounting pads formed in a plurality of mounting areas of the substrate, the white reflecting layer being provided around the mounting areas;
   a plurality of light-emitting devices mounted on the mounting pads, upper surfaces of the light-emitting devices being higher than an upper surface of the white reflecting layer; and
   a phosphor layer made of a translucent resin containing a phosphor and covering a predetermined number of the plurality of light-emitting devices, the phosphor layer comprising a plurality of phosphor portions, wherein:
   the phosphor layer is in contact with the light-emitting devices;
   at least a part of a periphery of the phosphor layer covers an edge of the white reflecting layer;
   each of the phosphor portions is formed in a hemispherical dome shape;
   the plurality of hemispherical dome shaped phosphor portions are strung together and form a row;
   a surface of the phosphor layer consists of a curved surface without having a flat surface;
   bases of adjacent hemispherical dome shapes merge with each other to form a continuous portion; and
   the continuous portion between the bases comprises a valley which does not have a flat surface.

2. The light-emitting apparatus of claim 1, wherein the light-emitting devices are mounted by being arranged on the substrate to form a row and are connected to one another by bonding wires that are formed in a direction along the row.

3. The light-emitting apparatus of claim 1, wherein the light-emitting devices are mounted by being arranged on the substrate to form a row, and an end of the phosphor layer covering the light-emitting devices that form the row is formed substantially in a spherical shape.

4. A luminaire comprising:
   a case; and
   a light-emitting apparatus provided in the case,
   the light-emitting apparatus comprising:
      a substrate comprising a wiring pattern and a white reflecting layer, the wiring pattern including a plurality of mounting pads formed in a plurality of mounting areas of the substrate, the white reflecting layer being provided around the mounting areas;
      a plurality of light-emitting devices mounted on the mounting pads, upper surfaces of the light-emitting devices being higher than an upper surface of the white reflecting layer; and
      a phosphor layer made of a translucent resin containing a phosphor and covering a predetermined number of the plurality of light-emitting devices, the phosphor layer comprising a plurality of phosphor portions, wherein:
      the phosphor layer is in contact with the light-emitting devices;
      at least a part of a periphery of the phosphor layer covers an edge of the white reflecting layer;
      each of the phosphor portions is formed in a hemispherical dome shape;
      the plurality of hemispherical dome shaped phosphor portions are strung together and form a row;
      a surface of the phosphor layer consists of a curved surface without having a flat surface;
      bases of adjacent hemispherical dome shapes merge with each other to form a continuous portion; and
      the continuous portion between the bases comprises a valley which does not have a flat surface.

* * * * *